United States Patent
Lee et al.

(10) Patent No.: US 10,903,442 B2
(45) Date of Patent: Jan. 26, 2021

(54) ORGANIC LIGHT-EMITTING DIODE COMPRISING SELF-CRYSTALLIZING MATERIAL AND ORGANIC LIGHT-EMITTING DISPLAY DEVICE INCLUDING THE SAME

(71) Applicant: Samsung Display Co., Ltd., Yongin-si (KR)

(72) Inventors: Changmin Lee, Suwon-si (KR); Jihye Shim, Namyangju-si (KR); Yeonwoo Lee, Jincheon-gun (KR); Jehong Choi, Suwon-si (KR); Hyunju Choi, Seoul (KR); Sangwoo Pyo, Seongnam-si (KR); Myungsuk Han, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 125 days.

(21) Appl. No.: 16/040,471

(22) Filed: Jul. 19, 2018

(65) Prior Publication Data

US 2019/0148663 A1    May 16, 2019

(30) Foreign Application Priority Data

Nov. 13, 2017   (KR) .......................... 10-2017-0150394

(51) Int. Cl.
| | | |
|---|---|---|
| *H01L 29/08* | (2006.01) | |
| *H01L 51/50* | (2006.01) | |
| *H01L 51/52* | (2006.01) | |
| *H01L 27/32* | (2006.01) | |
| *H05B 33/10* | (2006.01) | |

(52) U.S. Cl.
CPC ...... *H01L 51/5048* (2013.01); *H01L 27/3244* (2013.01); *H01L 51/5088* (2013.01); *H01L 51/5215* (2013.01); *H01L 51/5234* (2013.01); *H05B 33/10* (2013.01)

(58) Field of Classification Search
CPC .................. H01L 51/5048; H01L 27/3244
USPC .......................................................... 257/40
See application file for complete search history.

(56) References Cited

U.S. PATENT DOCUMENTS

| | | | |
|---|---|---|---|
| 5,714,838 A | 2/1998 | Haight et al. | |
| 7,545,093 B2 * | 6/2009 | Lin ..................... | H01L 51/5036 257/40 |
| 8,183,762 B2 | 5/2012 | Kim et al. | |

(Continued)

FOREIGN PATENT DOCUMENTS

| | | |
|---|---|---|
| JP | 2009-164113 A | 7/2009 |
| KR | 10-2008-0048339 A | 6/2008 |
| KR | 10-2017-0057729 A | 5/2017 |

*Primary Examiner* — Caleb E Henry

(74) *Attorney, Agent, or Firm* — Lewis Roca Rothgerber Christie LLP

(57) ABSTRACT

Disclosed are an organic light-emitting diode and an organic light-emitting display device including the same. The organic light-emitting diode includes: a first electrode; a second electrode disposed opposite to the first electrode; a light-emitting layer disposed between the first electrode and the second electrode; a hole transport region disposed between the first electrode and the light-emitting layer; and an electron transport region disposed between the light-emitting layer and the second electrode; the hole transport region including at least two layers, and one of the at least two layers is in contact with the first electrode and is a self-crystallizing material-containing layer.

18 Claims, 12 Drawing Sheets

(56) References Cited

U.S. PATENT DOCUMENTS

| | | | |
|---|---|---|---|
| 2004/0263045 A1* | 12/2004 | Smith | H01L 27/3211 313/373 |
| 2007/0224449 A1* | 9/2007 | Kato | H01L 51/0059 428/690 |
| 2010/0171106 A1* | 7/2010 | Jung | H01L 27/3246 257/40 |
| 2014/0054566 A1* | 2/2014 | Facchetti | H01L 51/5203 257/40 |
| 2014/0332794 A1* | 11/2014 | Birnstock | H01L 51/5268 257/40 |
| 2015/0053939 A1* | 2/2015 | Adamovich | H01L 51/0085 257/40 |
| 2017/0237042 A1* | 8/2017 | Biondo | H01L 51/0074 257/40 |

* cited by examiner

FIG. 15
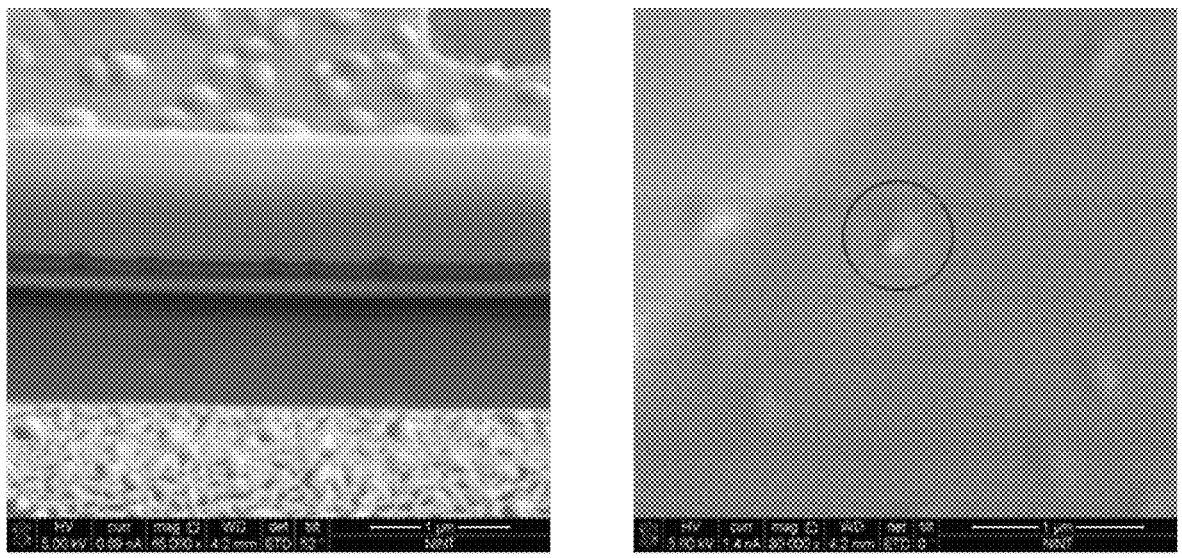
FIG. 16A  FIG.16B
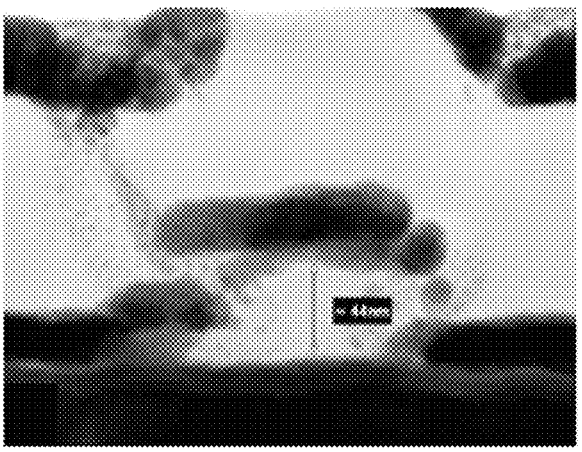 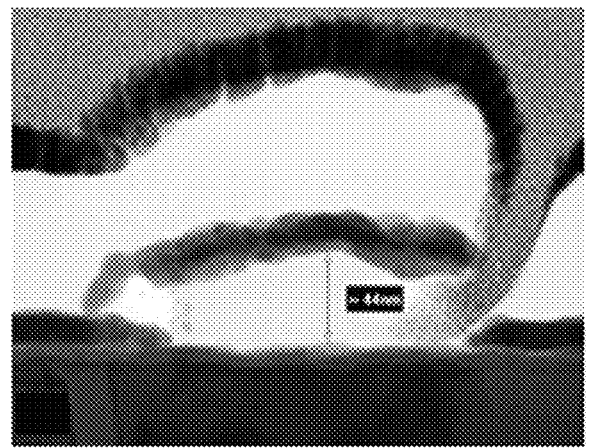

ORGANIC LIGHT-EMITTING DIODE COMPRISING SELF-CRYSTALLIZING MATERIAL AND ORGANIC LIGHT-EMITTING DISPLAY DEVICE INCLUDING THE SAME

CROSS-REFERENCE TO RELATED APPLICATION

This application claims priority to and the benefit of Korean Patent Application No. 10-2017-0150394, filed on Nov. 13, 2017, in the Korean Intellectual Property Office (KIPO), the entire content of which is incorporated herein by reference.

BACKGROUND

1. Field

Exemplary embodiments of the present disclosure relate to an organic light-emitting diode and an organic light-emitting display device including the same.

2. Description of the Related Art

An organic light-emitting display device is a self-luminescent display device that displays images by using organic light-emitting diodes that emit light. Such organic light-emitting display devices exhibit characteristics, such as low power consumption, high luminance, and high response speed, and are thus, currently attracting attention as a display device.

Generally, an organic light-emitting diode includes an anode and a cathode disposed opposite to each other, and an organic layer disposed between the anode and the cathode. Furthermore, the organic layer includes an organic light-emitting layer. Holes supplied from the anode and electrons supplied from the cathode combine to form excitons in the organic light-emitting layer. The organic-light emitting diode emits light by means of energy which is generated when the excitons drop (e.g., transition or relax) to a ground state.

As a method of improving luminance efficiency by effectively extracting the light emitted from the organic light-emitting layer, a microcavity may be used. The microcavity makes use of the principle that light is repeatedly reflected between a reflective layer (e.g., an anode electrode) and a transflective layer (e.g., a cathode electrode) spaced apart from each other by a set distance (an optical path length) and, thus, strong interference occurs between lights, so that light having a set or specific wavelength is amplified and light having other wavelengths is cancelled out. Accordingly, the front color reproducibility and luminance of the organic light-emitting display device may be improved.

In order to produce this microcavity effect, the distance between an anode and a cathode in each of red, green, and blue organic-light emitting diodes is determined in accordance with a corresponding one of red, green, and blue wavelengths, and the thickness of an organic layer disposed between the anode and the cathode is also determined in accordance with each of the wavelengths. However, when the organic layer is formed to have a large thickness in order to produce the microcavity effect, the amounts of organic materials used are increased, thereby increasing the manufacturing cost of the organic light-emitting display device.

Therefore, in order to reduce the amounts of organic materials used, research has been conducted to apply an organic layer which is capable of producing the microcavity effect while having a small thickness. However, if the thickness of the organic layer is made smaller, dark spots of metal particles occur due to the small thickness of the organic layer, with the result that a problem arises in that the yield of organic light-emitting display devices is reduced.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments of the present disclosure are directed to an organic light-emitting display device including a thin organic layer, which can be manufactured at a low cost and can substantially minimize or reduce the development of dark spots.

According to an exemplary embodiment of the present disclosure, there is provided an organic light-emitting diode including: a first electrode; a second electrode disposed opposite to the first electrode; a light-emitting layer disposed between the first electrode and the second electrode; a hole transport region disposed between the first electrode and the light-emitting layer; and an electron transport region disposed between the light-emitting layer and the second electrode; wherein the hole transport region includes at least two layers, and one of the at least two layers in contact with the first electrode is a self-crystallizing material-containing layer.

According to another exemplary embodiment of the present disclosure, there is provided An organic light-emitting diode including: a first electrode; a second electrode disposed opposite to the first electrode; and an organic layer disposed between the first electrode and the second electrode, and including a hole transport layer, a light-emitting layer, and an electron transport layer; and wherein any one selected from the hole transport layer, the light-emitting layer, and the electron transport layer includes a self-crystallizing material.

According to another exemplary embodiment of the present disclosure, there is An organic light-emitting display device including: a substrate; and a plurality of red organic light-emitting diodes, green organic light-emitting diodes, and blue organic light-emitting diode disposed on the substrate; wherein each of the plurality of red organic light-emitting diodes, green organic light-emitting diodes, and blue light-emitting diodes includes: a first electrode disposed on the substrate; an organic layer disposed on the first electrode, and including a hole transport region, a light-emitting layer, and an electron transport region; and a second electrode disposed on the organic layer; wherein the hole transport region includes at least two layers, and one of the at least two layers in contact with the first electrode is a self-crystallizing material-containing layer.

According to another exemplary embodiment of the present disclosure, there is provided an organic light-emitting display device including: a substrate; and a plurality of red organic light-emitting diodes, green organic light-emitting diodes, and blue organic light-emitting diode disposed on the substrate; wherein each of the plurality of red organic light-emitting diodes, green organic light-emitting diodes, and blue light-emitting diodes includes: a first electrode disposed on the substrate; an organic layer disposed on the first electrode, and including a hole transport layer, a light-emitting layer, and an electron transport layer; and a second electrode disposed on the organic layer; wherein any one selected from the hole transport layer, the light-emitting layer, and the electron transport layer includes a self-crystallizing material.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of embodiments of the present disclosure will be more clearly understood from the following detailed description taken in conjunction with the accompanying drawings, in which:

FIG. 15 shows Scanning Electron Microscopy (SEM) images illustrating the cross-sectional structure of an organic light-emitting diode into which a self-crystallizing material-containing layer has been introduced according to an exemplary embodiment of the present disclosure;

FIGS. 16A-16B show Transmission Electron Microscopy (TEM) images illustrating the cross-sectional structures of the organic light-emitting diodes of Examples 1 and 2 into each of which a self-crystallizing material-containing layer has been introduced.

DETAILED DESCRIPTION

Features of embodiments of the present disclosure and methods for achieving them will become apparent from exemplary embodiments described below in more detail in conjunction with the accompanying drawings. However, the present disclosure is not limited to the following exemplary embodiments, but is embodied in various different forms. These exemplary embodiments are provided merely to make the present disclosure complete and fully convey the scope of the subject matter of the present disclosure to a person having ordinary knowledge in the art to which the present disclosure pertains. The present disclosure is defined only by the scope of the attached claims, and equivalents thereof. Therefore, in some exemplary embodiments, well-known process steps, device structures, and technologies are not described in more detail in order to prevent the present disclosure from being obscurely interpreted. Throughout the specification, the same reference symbols refer to the same components.

Unless otherwise defined, all terms used herein (including technical and scientific terms) will have the same meanings as commonly understood by a person having ordinary knowledge in the art to which the present disclosure pertains. Terms, such as those defined in commonly used dictionaries, should not be interpreted in ideal or excessively formal senses unless clearly and particularly defined.

<Organic Light-Emitting Diode>

Figure 1:
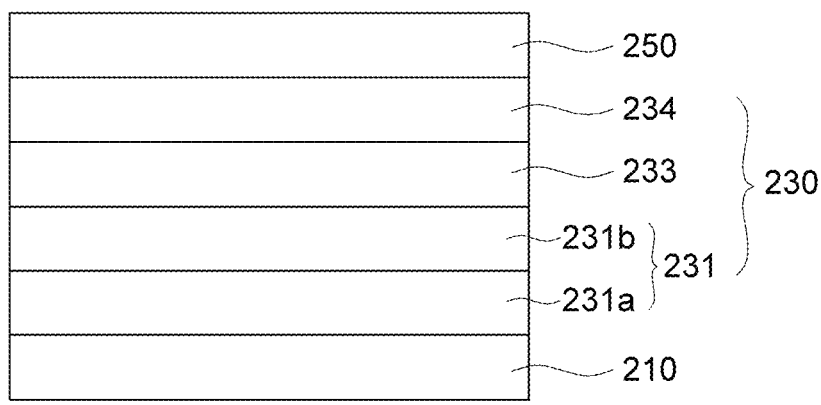
FIG. 1 is a cross-sectional view illustrating the structure of an organic light-emitting diode according to an exemplary embodiment of the present disclosure.

FIG. 1 is a cross-sectional view schematically illustrating the structure of an organic light-emitting diode according to an exemplary embodiment of the present disclosure.

Referring to FIG. 1, the organic light-emitting diode includes: a first electrode 210; a second electrode 250; and a hole transport region 231, a light-emitting layer 233, and an electron transport region 234 sequentially disposed between the first electrode 210 and the second electrode 250. Optionally, the organic light-emitting diode may further include at least any one selected from a hole-blocking layer disposed between the light-emitting layer 233 and the electron transport region 234, a diffusion barrier layer disposed between the electron transport region 234 and the second electrode 250, and a capping layer 310 disposed on the second electrode 250.

Certain individual components of the organic light-emitting diode will be described in more detail below.

Substrate

In the organic light-emitting diode according to the present disclosure, any suitable substrate available in the field of organic light-emitting diodes may be used as a substrate 110 without limitation. When the mechanical strength, thermal stability, transparency, surface smoothness, easy handling, and waterproofness of the organic light-emitting diode are considered, the substrate 110 may be a glass substrate or transparent plastic substrate.

First Electrode

In the organic light-emitting diode according to the present disclosure, the first electrode 210 may be disposed on the substrate 110, and may be electrically coupled to (e.g., electrically connected to) a driving thin-film transistor and receive a driving current from the driving thin-film transistor. This first electrode 210 may include a material having a relatively high work function. Accordingly, the first electrode 210 serves as an anode that injects holes into the adjacent hole transport region 231. In this case, the second electrode 250 disposed opposite to the first electrode 210 serves as a cathode that injects electrons into the adjacent electron transport region 234. However, the first electrode 210 and the second electrode 250 are not limited thereto. In some cases, the first electrode 210 may serve as a cathode, and the second electrode 250 may serve as an anode.

The first electrode 210 may include a silver (Ag)-based reflective layer having high reflectivity in order to fabricate a top active matrix organic light-emitting diode (AMO-LED). In this case, the first electrode 210 is a reflective electrode. The organic light-emitting display device including the first electrode 210 may have a top-emission structure. According to one example, the first electrode 210 has a two-layer structure including a silver (Ag)-based reflective layer and a transparent conductive layer disposed on the reflective layer. According to another example, the first electrode 210 has a three-layer structure including a transparent conductive layer ("a first transparent conductive layer"), a reflective layer, and a transparent conductive layer ("a second transparent conductive layer"). In the first electrode 210 having the three-layer structure, the first transparent conductive layer substantially functions as an anode electrode, and the second transparent conductive layer functions to adjust a work function.

The silver (Ag)-based reflective layer may be a silver (Ag) or Ag alloy reflective layer. In this case, the Ag alloy may include one or more metals selected from among magnesium (Mg), gold (Au), calcium (Ca), lithium (Li), chromium (Cr), copper (Cu), and aluminum (Al). This Ag-based reflective layer may have a thickness in a range of from about 50 to 100 nm.

The transparent conductive layer may include a transparent material having a relatively high work function, for example, a transparent conductive oxide (TCO). Non-limiting examples thereof include ITO (indium tin oxide), IZO (indium zinc oxide), ZnO (zinc oxide), AZO (aluminum zinc oxide), $In_2O_3$(indium oxide), $SnO_2$ (tin oxide), and the like, which may be used alone or as a mixture of two or more thereof. This transparent conductive layer may have a thickness in a range of from about 2 to 10 nm, for example, from about 4 to 7 nm.

A method for forming the first electrode 210 is not particularly limited, but the first electrode 210 may be formed using any suitable method available in the art. Examples thereof include, but are not limited to, a sputtering method, a deposition method, and the like.

Second Electrode

In the organic light-emitting diode according to the present disclosure, the second electrode 250 is disposed opposite to the above-described first electrode 210. For example, the second electrode 250 is disposed on the electron transport region 234. This second electrode 250 may include a material having a relatively low work function. In this case, the second electrode 250 functions to inject electrons into the adjacent electron transport region 234, and thus serves as a cathode.

The second electrode 250 may be silver (Ag), aluminum (Al), magnesium (Mg), or an alloy thereof, and may include a silver (Ag)-containing material. In this case, the second electrode 250 may be a transmissive or transflective electrode, and the organic light-emitting display device including the second electrode 250 may have a top-emission structure. In this case, the light emitted from the light-emitting layer 233 may pass through the second electrode 250, and may be also reflected from the bottom of the second electrode 250. Accordingly, the light emitted from the light-emitting layer 233 may be repeatedly reflected between the top of the reflective layer 211 in the first electrode 210 and the bottom of the second electrode 250.

The Ag-containing material may be silver (Ag), a silver-containing alloy, or the like. An example of the silver-containing alloy includes, but is not limited to, an alloy of silver (Ag) and one or more metals selected from among magnesium (Mg), lithium (Li), calcium (Ca), chromium (Cr), and copper (Cu). According to an example, the Ag-containing material may be an alloy of Ag and Mg, and the weight ratio between Ag and M may be in a range of from 8 to 20:1 (w/w), for example, from 10 to 15:1 (w/w). When the content of silver in the second electrode 250 is high as described above, the second electrode 250 may have excellent current conductivity, and thus the efficiency of the organic light-emitting diode may be improved.

The second electrode 250 may have a thickness in a range of from about 5 to 20 nm. When the thinning and electron supply functions of the diode are considered, the second electrode 250 may have a thickness in a range of from about 10 to 15 nm.

A method for forming the second electrode 250 is not particularly limited, but the second electrode 250 may be formed using any suitable method available in the art, like the above-described first electrode. Examples of the method include, but are not limited to, a sputtering method, a deposition method, and the like.

Hole Transport Region

In the organic light-emitting diode of the present disclosure, the hole transport region 231 is a portion of the organic layer 230 disposed on the first electrode 210, and functions to transport holes, injected from the first electrode 210, to the adjacent light-emitting layer 233. This hole transport region 231 may include one or more selected from the group consisting of a hole injection layer 231a and a hole transport layer 231b, and may further include any suitable buffer layer available in the art as desired.

According to an implementation of the present disclosure, the hole transport region 231 includes at least two layers, and one of the at least two layers, which comes into contact with the first electrode, includes a self-crystallizing material.

The self-crystallizing material may be a material that is spontaneously crystallized by self-assembly after deposition. The self-crystallizing material may have a glass transition temperature Tg of 150° C. or below, for example, 100° C. or below.

For example, the self-crystallizing material may be represented by any one selected from Formulas 1 to 4 below:

Formula 1

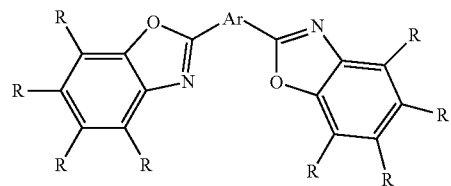

wherein:

Ar is a $C_6$-$C_{40}$ aryl group or a heteroaryl group having 5 to 40 nuclear atoms;

a plurality of R(s) are the same or different, and are each independently selected from the group consisting of a hydrogen atom, a halogen, a nitro group, a cyano group, an amine group, a $C_1$-$C_{40}$ alkyl group, a $C_6$-$C_{40}$ aryl group, and a heteroaryl group having 5 to 40 nuclear atoms; and the alkyl, amine, aryl, and heteroaryl groups of Ar and Rs are each independently unsubstituted or substituted with one or more substituents selected from the group consisting of heavy hydrogen, a halogen, a cyano group, a nitro group, a $C_1$-$C_{40}$ alkyl group, a $C_6$-$C_{40}$ aryl group, a heteroaryl group having 5 to 60 nuclear atoms, a $C_6$-$C_{40}$ aryloxy group, a $C_6$-$C_{40}$ arylphosphine oxide group, and a $C_6$-$C_{40}$ aryl amine group, wherein, when the substituents are plural in number, they may be the same or different.

Formula 2

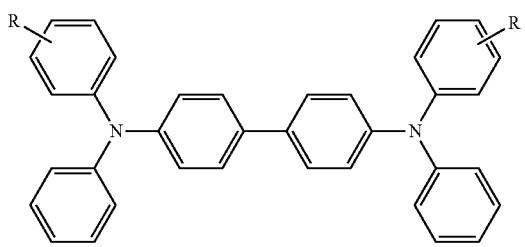

wherein a plurality of R(s) are the same or different, and are each independently selected from the group consisting of a hydrogen atom, a halogen, a nitro group, a cyano group, a $C_1$-$C_6$ alkyl group, a $C_6$-$C_{20}$ aryl group, and a heteroaryl group having 5 to 20 nuclear atoms.

Formula 3

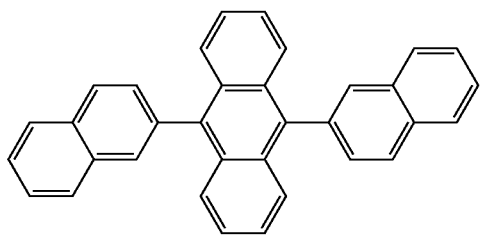

Formula 4

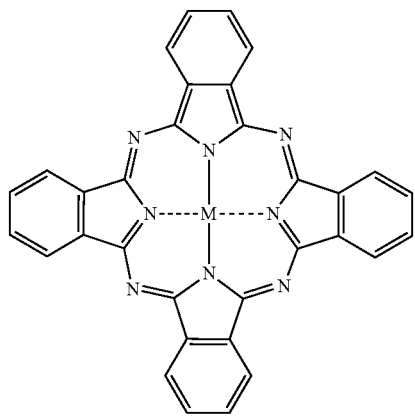

wherein M may be selected from the group consisting of Cu, Pt, Zn, and Er.

According to an implementation of the present disclosure, in Formula 1, Ar may be a $C_6$-$C_{20}$ aryl group, and R(s) may be each independently selected from the group consisting of a hydrogen atom, a halogen, a nitro group, a cyano group, an amine group, a $C_1$-$C_{20}$ alkyl group, a $C_6$-$C_{20}$ aryl group, and a heteroaryl group having 5 to 20 nuclear atoms. The term "heteroaryl", as used herein, denotes a monovalent substituent derived from a mono- or polyheterocyclic aromatic hydrocarbon of 5 to 60 nuclear atoms in which at least one, for example, one to three carbon atoms of the ring are substituted by a heteroatom such as N, O, S or Se.

Furthermore, according to an implementation of the present disclosure, Formula 2 may be specified by any one selected from Formulas 2a and 2b below:

Formula 2a

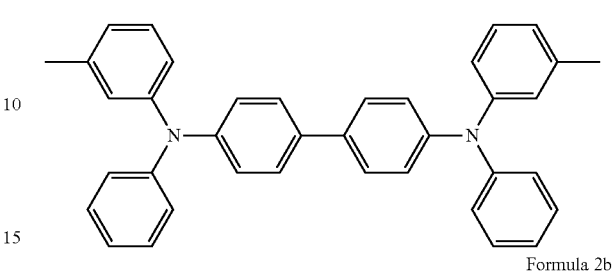

Formula 2b

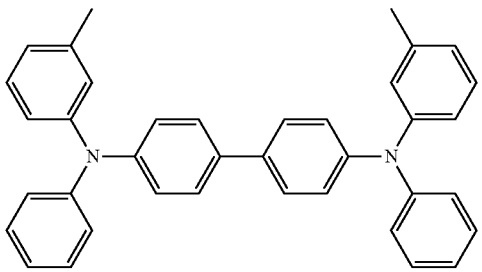

Furthermore, examples of the phthalocyanine compound represented by Formula 4 include erbium (III) bis-phthalocyanine, copper (II) phthalocyanine, platinum phthalocyanine, zinc phthalocyanine, and the like.

The self-crystallizing materials represented by Formulas 1 to 4 may be used alone or as a mixture of two or more thereof. In this case, in the present specification, the compounds represented by Formulas 1 to 4 as self-crystallizing materials are particularly illustrated and described. However, the compounds are not limited thereto. Other materials that have the above-described physical properties and are crystallized by self-assembly fall within the scope of the present disclosure.

According to embodiments of the present disclosure, the self-crystallizing material has the characteristic of spontaneously crystallizing, and includes a plurality of nanocrystals in the inside of a corresponding self-crystallizing material-containing layer and/or on the surface thereof after deposition. The size of the nanocrystals is not particularly limited. As an example, the plurality of nanocrystals may be a plurality of circular or hemispheric nanocrystals having a size enabling the capture of metal particles (for example, Ag particles having a diameter of about 70 to 200 nm) causing dark spots in an organic light-emitting diode, for example, the size of the nanocrystals may have a cross-sectional diameter of 40 to 200 nm and a height of 40 to 200 nm.

Furthermore, the self-crystallizing material-containing layer includes a plurality of nanocrystals not only in the inside of the corresponding layer but also on the surface thereof, and may thus have a surface having uneven texture. As an example, the self-crystallizing material-containing layer may have a plurality of embossed nanopatterns on at least one of a first surface in a contact with the first electrode 210 and a second surface, i.e., a surface opposite to the first surface, for example, the second surface. In this case, the shape of the embossed nanopatterns is not particularly limited, and examples of a cross-sectional shape include a semispherical shape, a triangular shape, a polygonal shape, irregular shape, etc.

The self-crystallizing material-containing layer according to an example of the present disclosure is disposed in one region of the hole transport region 231 in contact with the first electrode 210, for example, in the hole injection layer 231a.

For example, the first electrode 210 includes a metal, e.g., Ag, as the reflective layer. When an impact or defect occurs during the formation of the first electrode, the metal particle passes through part of the organic layer disposed between the first electrode and the second electrode, and thus a short circuit occurs, with the result that a metal particle dark spot phenomenon is caused. In contrast, in the present disclosure, the self-crystallizing material-containing layer is disposed in the hole injection layer 231a in contact with the first electrode 210. Accordingly, even when the metal particles (e.g., Ag particles) of the first electrode surface are present, a plurality of self-crystallizing nanocrystals captures the metal particles while surrounding them. Accordingly, a short circuit may be prevented from occurring among the first electrode, the Ag metal particles, and the second electrode (or a likelihood or degree of such short circuit may be reduced), and the development of dark spots attributable to the Ag metal particles may be maximally suppressed (or reduced). Furthermore, the self-crystallizing material-containing layer has mechanical strength, and may thus function to protect the organic layer from impact damage and a defect that may occur during the formation of the first electrode. Due to the Ag particles captured as described above, the self-crystallizing material-containing layer of the present disclosure may include Ag particles in the inside of the corresponding layer and/or on the surface thereof. The quantity of the Ag particles is not particularly limited.

In the organic light-emitting diode of the present disclosure, the hole transport region 231 is not limited to the particular components, number of layers, thickness, structure, or the like of the hole transport region 231 as long as it has a structure in which a self-crystallizing material-containing layer is disposed on a surface in contact with the first electrode 210.

For example, the hole transport region 231 includes at least two of hole injection layer 231a, the hole transport layer 231b, and the buffer layer, and the self-crystallizing material-containing layer may be the hole injection layer 231a.

The self-crystallizing material may perform both a self-crystallizing function and a hole injection function, or may perform only the self-crystallizing function. In this case, since it is difficult for the self-crystallizing material having only the self-crystallizing function to perform the hole injection function, the hole transport region 231, e.g., the hole injection layer 231a, may include any suitable charge-generation material (e.g., a p-type dopant) available in the art in order to facilitate hole injection between the first electrode 210 and the hole transport region 231. The hole injection layer 231a including the self-crystallizing material and optionally including the p-type dopant as described above may be a single-layer structure including one type (or kind) of material, a single-layer structure including a plurality of different materials, or a multilayer structure including two or more layers composed of different materials.

According to an implementation of the present disclosure, the hole transport region 231 includes: the hole injection layer 231a including a self-crystallizing material-containing layer; and the hole transport layer 231b. The hole injection layer 231a may be a hole injection layer that includes a mixture of a self-crystallizing material and a p-type dopant and has a single layer structure.

The p-type dopant is not particularly limited as long as it is available in the art. Examples of the p-type dopant include p-type inorganic dopants (inorganic materials), p-type organic dopants (organic materials), mixtures thereof, etc.

Available p-type organic dopants include quinone derivatives, etc. Examples of the available p-type organic dopants include tetracyanoquinonedimethane (TCNQ), 2,3,5,6-tetrafluoro-tetracyano-1,4-benzoquinonedimethane (F4TCNQ), mixtures thereof, and the like.

Furthermore, the p-type inorganic dopants may include materials containing a metal or metalloid while performing a dopant function without limitation. Examples of the p-type inorganic dopants include metal oxides containing at least one type (or kind) of metal or metalloid, metal iodides, mixtures thereof, and the like.

The metal oxides may be oxides containing any suitable metal (e.g., an alkali metal, an alkali earth metal, a transition metal, or the like) and/or a metalloid (e.g., a group 13 element, a group 14 element, or the like) available in the art. Examples of the metal oxides include a tungsten oxide, a molybdenum oxide, a rhenium oxide (ReO), mixtures thereof, and the like.

The metal iodides may be iodides containing at least one type (or kind) of metal selected from the group consisting of an alkali metal, an alkali earth metal, and a transition metal. Examples of the metal iodides include a copper iodide (CuI), a bismuth iodide (BiI), mixtures thereof, and the like.

Meanwhile, in the self-crystallizing material-containing layer according to the present disclosure, a plate-shaped or stacking material film may be formed depending on the type (or kind) of self-crystallizing material. The density of the plate-shaped or stacking material film decreases during a crystallization process, and thus a plurality of fine voids become present inside a crystal. The fine empty spaces form a diffusion path along which the metal particles (e.g., Ag particles) of the first electrode diffuse toward the organic layer 230, and thus progressive dark spots may be developed. In contrast, when a single self-crystallizing material-containing layer is formed by mixing a self-crystallizing material and a high-density p-type inorganic dopant (e.g., a metal oxide, a metal iodide, or the like), the dense inorganic dopant fills and covers the above-described plurality of fine voids, and thus, the density of the self-crystallizing material-containing layer is increased, with the result that the phenomenon in which the metal particles originating from the first electrode diffuse may be significantly suppressed or reduced. Accordingly, when the self-crystallizing material and the p-type (or kind) of inorganic dopant are co-deposited to form the hole injection layer 231a as a single layer, the p-type dopant may include a high-density p-type inorganic dopant.

The single hole injection layer 231a including the above-described p-type inorganic dopant may exhibit a density increase effect compared to the hole injection layer 231a formed by using the self-crystallizing material alone. The density of the hole injection layer 231a including the p-type inorganic dopant is not particularly limited. As an example, the density of the hole injection layer 231a may fall within a range that exceeds the density of a hole injection layer formed by using a self-crystallizing material alone.

The content of the p-type dopant may be suitably or appropriately adjusted within a range available in the art. As an example, the doping quantity of the p-type dopant may be in a range from 0.5 to 50 weight % based on the total weight of the corresponding self-crystallizing material-containing layer (e.g., the total weight of the self-crystallizing material and the p-type dopant which is 100 weight %), for example, from 5 to 50 weight %.

According to another implementation of the present disclosure, the hole transport region 231 includes: the hole injection layer 231a including a self-crystallizing material-containing layer; and the hole transport layer 231b. The hole injection layer 231a may be a multilayer structure including at least two layers in which a self-crystallizing material-containing layer and a p-type dopant-containing layer are stacked.

The p-type dopant-containing layer may include p-type dopants available in the art without limitation. This p-type dopant may be the same as or different from the dopant component introduced into the above-described single layer. Furthermore, the p-type dopant-containing layer may further include a component selected from the group consisting of any suitable hole injection materials and any suitable hole transport materials available in the art.

The hole injection material may include any suitable transport materials available in the art without limitation. Non-limiting examples of the available hole injection materials include phthalocyanine compounds, such as copper phthalocyanine; DNTPD (N,N'-diphenyl-N,N'-bis-[4-(phenyl-m-tolyl-amino)-phenyl]-biphenyl-4,4'-diamine), m-MT-DATA (4,4',4"-tris(3-methylphenylphenylamino)triphenylamine), TDATA (4,4'4"-Tris(N,N-diphenylamino) triphenylamine), 2TNATA (4,4',4"-tris{N-(2-naphthyl)-N-phenylamino}-triphenylamine), PEDOT/PSS (poly(3,4-ethylened ioxythiophene)/poly(4-styrenesulfonate)), PANI/DBSA (polyaniline/dodecylbenzenesulfonic acid), PANI/CSA (polyaniline/camphor sulfonic acid), PANI/PSS (polyaniline)/poly(4-styrenesulfonate)), and the like. These may be used alone or as a mixture of two or more thereof.

Furthermore, the hole transport material includes any suitable hole transport materials available in the art. Non-limiting examples of the available hole transport materials include carbazole-based derivatives, such as phenylcarbazole, polyvinylcarbazole or the like; fluorine-based derivatives; triphenylamine-based derivatives, such as TPD (N,N'-bis(3-methylphenyl)-N,N'-diphenyl-[1,1-biphenyl]-4,4'-diamine), TCTA (4,4',4"-tris(N-carbazolyl)triphenylamine) or the like; NPB (N,N'-di(1-naphthyl)-N,N'-diphenylbenzidine), TAPC(4,4'-cyclohexylidene bis[N,N-bis(4-methylphenyl)benzenamine]), and the like. These may be used alone or as a mixture of two or more thereof.

In the present disclosure, the hole transport layer 231b formed on the hole injection layer 231a may be configured to include any suitable hole transport material available in the art.

The hole transport region 231 may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Light-Emitting Layer

In the organic light-emitting diode of the present disclosure, the light-emitting layer 233 is disposed between the first electrode 210 and the second electrode 250. For example, the light-emitting layer 233 is disposed on the hole transport region 231. This light-emitting layer 233 is a layer in which holes and electrons, injected from the first electrode 210 and the second electrode 250, respectively, combine to form excitons. The color of light emitted from the organic light-emitting diode may differ depending on a material forming the light-emitting layer.

The light-emitting layer 233 may include a host, and may optionally further include a dopant. When the light-emitting layer 233 includes the host and the dopant, the content of the dopant may be in a range of from about 0.01 to 25 parts by weight, for example, from about 0.01 to 15 parts by weight, based on 100 parts by weight of the host, but is not limited thereto.

The host may be any suitable one available in the art, and is not particularly limited. Examples of the host include, but are not limited to, $Alq_3$ (tris(8-quinolinolato)aluminum), CBP (4,4'-bis(N-carbazolyl)-1,1'-biphenyl), PVK (poly(N-vinylcarbazole), ADN (9,10-di(naphthalene-2-yl)anthracene, TCTA (4,4',4"-tris(carbazol-9-yl)-triphenylamine, TPBI (1,3,5-tris(N-phenylbenzimidazole-2-yl)benzene, TBADN (3-tert-butyl-9,10-di(naphth-2-yl)anthracene, DSA (distyrylarylene), E3 or CDBP (4,4'-bis(9-carbazolyl)-2,2'-dimethyl-biphenyl), and the like.

The dopant may be any suitable one available in the art, and is not particularly limited. Such dopants may be classified into fluorescent dopants, and phosphorescent dopants. The phosphorescent dopants may be metal complexes including Ir, Pt, Os, Re, Ti, Zr, Hf, or a combination of two or more thereof, but are not limited thereto.

Meanwhile, such dopants may be classified into red dopants, green dopants, and blue dopants. Any suitable red dopants, green dopants, and blue dopants, available in the art, may be used without particular limitation.

For example, non-limiting examples of the red dopant include PtOEP (Pt(II) octaethylporphyrin), $Ir(piq)_3$ (tris(2-phenylisoquinoline)iridium), $Btp_2Ir(acac)$ (bis(2-(2'-benzothienyl)-pyridinato-N,C3')iridium(acetylacetonate), and the like, which may be used alone or as a mixture of two or more thereof.

Furthermore, non-limiting examples of the green dopant include $Ir(ppy)_3$ (tris(2-phenylpyridine)iridium), $Ir(ppy)_2$ (acac) (bis(2-phenylpyridine)(acetylacetonato)iridium(II)), $Ir(mppy)_3$ (tris(2-(4-tolyl)phenylpiridine)iridium), C545T (10-(2-benzothiazolyl)-1,1,7,7-tetramethyl-2,3,6,7-tetrahydro-1H,5H,11H-[1]benzopyrano[6,7,8-ij]-quinolizin-11-one), and the like, which may be used alone or as a mixture of two or more thereof.

Furthermore, non-limiting examples of the blue dopant include $F_2Irpic$ (bis[3,5-difluoro-2-(2-pyridyl)phenyl](picolinato)iridium(III)), $(F_2ppy)_2Ir(tmd)$, $Ir(dfppz)_3$, DPVBi (4,4'-bis(2,2'-diphenylethen-1-yl)biphenyl) DPAVBi (4,4'-bis[4-(diphenylamino)styryl]biphenyl), TBPe (2,5,8,11-tetra-tert-butylperylene), and the like, which may be used alone or as a mixture of two or more thereof.

The light-emitting layer 233 may be a single layer including one type (or kind) of material, a single layer including a plurality of different materials, or a multilayer including two or more layers composed of different materials. When the light-emitting layer 233 includes a plurality of layers, the organic light-emitting diode may emit light having various suitable colors. Furthermore, when the light-emitting layer 233 includes a plurality of layers, the driving voltage of the diode may increase, but the current value of the organic light-emitting diode may become constant, and thus the organic light-emitting diode may have a luminous efficiency that is improved by the number of the light-emitting layers.

This light-emitting layer 233 may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Electron Transport Region

In the organic light-emitting diode of the present disclosure, the electron transport region 234 is disposed on the light-emitting layer 233, and functions to transport electrons, injected from the second electrode 250, to an adjacent layer, for example, the light-emitting layer 233.

This electron transport region 234 may include one or more selected from the group consisting of an electron transport layer and an electron injection layer. As an example, the electron transport region 234 includes the electron transport layer. As another example, the electron transport region 234 may include the electron transport layer and the electron injection layer.

The electron transport region 234 includes a material into which electrons are easily injected and which has high electron mobility.

For example, the electron transport layer includes any suitable electron transport material available in the art. Non-limiting examples of the electron transport material include oxazole-based compounds, isoxazole-based compounds, triazole-based compounds, isothiazole-based compounds, oxadiazole-based compounds, thiadiazole-based compounds, perylene-based compounds, aluminum complexes (e.g., Alq3 (tris(8-quinolinolato)-aluminum), BAlq, SAlq, and Almq3), gallium complexes (e.g., Gaq'2OPiv, Gaq'2OAc, 2(Gaq'2)), and the like, which may be used alone or a mixture of two or more thereof.

Furthermore, the electron injection layer includes any suitable electron injection material available in the art. Non-limiting examples of the electron injection material include LiF, $Li_2O$, BaO, NaCl, CsF; lanthanide metals, such as Yb, and the like; and metal halides, such as RbCl, RbI, and the like, which may be used alone or a mixture of two or more thereof.

The electron transport region 234 may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Auxiliary Light-Emitting Layer

Optionally, the organic light-emitting diode of the present disclosure may further include an auxiliary light-emitting layer disposed between the hole transport region 231 and the light-emitting layer 233. The auxiliary light-emitting layer functions to transport holes, moved from the hole transport region, to the light-emitting layer, and also functions to control the thickness of an organic layer.

This auxiliary light-emitting layer may include a hole transport material, and may include the same (e.g., substantially the same) material as the hole transport region. Furthermore, the auxiliary light-emitting layers of red, green and blue organic light-emitting diodes may include the same (e.g., substantially the same) material.

Examples of the material of the auxiliary light-emitting layer, which are available in the present disclosure, include, but are not limited to, NPD (N,N-dinaphthyl-N,N'-diphenylbenzidine), TPD (N,N'-bis-(3-methylphenyl)-N,N'-bis(phenyl)-benzidine), s-TAD, MTDATA (4,4',4"-tris(N-3-methylphenyl-N-phenyl-amino)-triphenylamine), and the like, which may be used alone or as a mixture of two or more thereof. Furthermore, the auxiliary light-emitting layer may include a p-type dopant in addition to the above-described material. As the p-type dopant, a p-type dopant any suitable one available in the art may be used.

Hole-Blocking Layer

Optionally, the organic light-emitting diode of the present disclosure may further include a hole-blocking layer disposed between the electron transport region 234 and the light-emitting layer 233. When the light-emitting layer 233 includes a phosphorescent dopant, the hole-blocking layer can prevent triplet excitons or holes from diffusing toward the electron transport region (or reduce a likelihood or degree of such diffusion).

The hole-blocking layer may include an oxadiazole derivative, a triazole derivative, a phenanthroline derivative (e.g., BCP), or the like.

The thickness of this hole-blocking layer is not particularly limited, and may be controlled within the range in which the driving voltage does not substantially increase. For example, the thickness may be in a range of from about 5 to 10 nm.

The hole-blocking layer may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Diffusion Barrier Layer

Optionally, the organic light-emitting diode according to the present disclosure may further include a diffusion barrier layer disposed between the electron transport region 234 and the second electrode 250. This diffusion barrier layer functions to prevent one component, e.g., an Ag component, from diffusing into the electron transport region 234 inside the second electrode (or to reduce a likelihood or degree of such diffusion).

The diffusion barrier layer may include any suitable material available in the art without limitation.

The above-described diffusion barrier layer may be a single layer including one type (or kind) of material, or a single layer including a mixture of two different materials. Alternatively, the diffusion barrier layer may be a multilayer including layers composed of two or more types (or kinds) of different materials.

The diffusion barrier layer may be formed using any suitable method available in the art. Examples of the method include, but are not limited to, a vacuum deposition method, a spin coating method, a cast method, a Langmuir-Blodgett (LB) method, an inkjet printing method, a laser printing method, a laser-induced thermal imaging (LITI) method, and the like.

Capping Layer

Optionally, the organic light-emitting diode of the present disclosure may further include a capping layer 310 disposed on the above-described second electrode 250. The capping layer functions to protect the organic light-emitting diode, and also functions to help the light, emitted from the organic layer, to be efficiently emitted to the outside.

The capping layer may include at least one selected from the group consisting of tris-8-hydroxyquinolinealuminum (Alq3), ZnSe, 2,5-bis(6'-(2',2"-bipyridyl))-1,1-dimethyl-3,4-diphenylsilole, 4'-bis[N-(1-naphthyl)-N-phenyl-amino]biphenyl (α-NPD), N,N'-diphenyl-N,N'-bis(3-methylphenyl)-1,1'-biphenyl-4,4'-diamine (TPD), and 1,1'-bis(di-4-tolylaminophenyl)cyclohexane (TAPC). The material forming this capping layer is inexpensive compared to the materials of other layers of the organic light-emitting diode. Accordingly, resonance may be produced between the reflective layer of the first electrode and the top 311 of the capping layer by adjusting the thickness of the capping layer including an inexpensive material instead of reducing the use of expensive organic materials by reducing the distance between the first electrode 210 and the second electrode 250.

Although this capping layer may also be a single layer, it may include two or more layers having different refractive indices so that the reflective index can change gradually while passing through the two or more layers.

The capping layer 310 may be formed using any suitable method available in the art. Examples of the method include various suitable methods, such as a vacuum deposition method, a spin coating method, a cast method, a Langmuir-Blodgett (LB) method, and the like.

The organic light-emitting diode of the present disclosure, which includes the above-described components, may be fabricated according to any suitable method available in the art. For example, the organic light-emitting diode may be fabricated by vacuum-depositing the first electrode material on a substrate and then sequentially vacuum-depositing the hole transport region material, the light-emitting layer material, the electron transport region material, and the second electrode material on the first electrode.

Meanwhile, in the present specification, there is described an example in which the self-crystallizing material-containing layer is introduced into one region of the hole transport region 231 in contact with the first electrode 210, e.g., the hole injection layer 231a. However, the present disclosure is not limited thereto. The self-crystallizing material-containing layer may be applied to components of the organic light-emitting diode in various suitable manners.

In this case, the location to which the self-crystallizing material-containing layer is introduced is not particularly limited. As an example, the self-crystallizing material-containing layer may be disposed on at least one of the hole transport region 231, the light-emitting layer 233, and the electron transport region 234 in a single layer or two or more layers. For example, the self-crystallizing material-containing layer may be any one selected from the hole transport layer 231b, the light-emitting layer 233, the electron injection layer, and the electron transport layer. Furthermore, the self-crystallizing material-containing layer introduced into the organic light-emitting diode according to the present disclosure may be introduced in the form of a single layer including one type (or kind) of material, a single layer including a plurality of different materials, or a multilayer including two or more layers composed of different materials.

FIGS. 2-6 are cross-sectional views illustrating structures in each of which the self-crystallizing material-containing layer has been introduced into the organic light-emitting diode according to the present disclosure.

Figure 2:
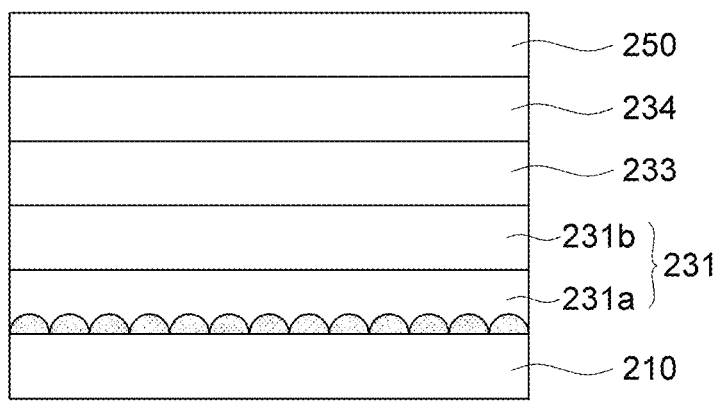
FIGS. 2-6 are cross-sectional views illustrating structures in each of which a self-crystallizing material-containing layer has been introduced into an organic light-emitting diode according to exemplary embodiments of the present disclosure.

FIG. 2 is a cross-sectional view illustrating the structure of an organic light-emitting diode in which a self-crystallizing material has been introduced into a hole injection layer 231a.

Referring to FIG. 2, an organic light-emitting diode according to an exemplary embodiment of the present disclosure includes: a first electrode 210; a second electrode 250 disposed opposite to the first electrode 210; and a hole transport region 231, a light-emitting layer 233, and an electron transport region 234 disposed between the first electrode 210 and the second electrode 250. The hole transport region 231 includes a hole injection layer 231a and a hole transport layer 231b. A self-crystallizing material-containing layer is disposed in the hole injection layer 231a.

In this case, the self-crystallizing material-containing layer is disposed in one region of the hole injection layer 231a that comes into contact with the first electrode 210. The self-crystallizing material-containing layer may have a plurality of embossed nanopatterns on at least one of a first surface in contact with the first electrode 210 and a second surface, i.e., a surface opposite to the first surface, for example, on the second surface.

FIGS. 3-6 are cross-sectional views illustrating the structures of organic light-emitting diodes in each of which a self-crystallizing material has been introduced into any one selected from components other than the hole injection layer 231a, e.g., the hole transport layer 231b, the light-emitting layer 233, and the electron transport region 234.

Figure 3:
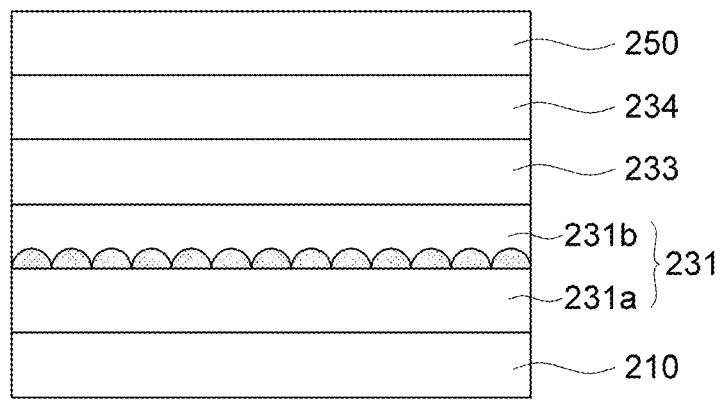

Referring to FIG. 3, an organic light-emitting diode according to an exemplary embodiment of the present disclosure includes: a first electrode 210; a second electrode 250 disposed opposite to the first electrode; and a hole transport region 231, a light-emitting layer 233, and an electron transport region 234 disposed between the first electrode and the second electrode. The hole transport region 231 includes a hole injection layer 231a and a hole transport layer 231b. A self-crystallizing material-containing layer is disposed in the hole transport layer 231b.

In this case, the self-crystallizing material-containing layer is located between the hole injection layer 231a and the hole transport layer 231b. The self-crystallizing material-containing layer may have a plurality of embossed nanopatterns on at least one of the first surface of the hole transport layer 231b in contact with the hole injection layer 231a and the second surface thereof, i.e., the surface opposite to the first surface.

Figure 4:
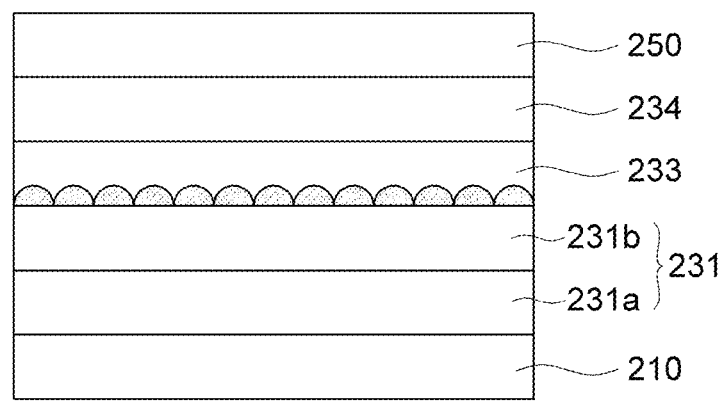

Referring to FIG. 4, an organic light-emitting diode according to an exemplary embodiment of the present disclosure includes: a first electrode 210; a second electrode 250 disposed opposite to the first electrode; a hole transport region 231, a light-emitting layer 233, and an electron transport region 234 disposed between the first electrode and the second electrode. A self-crystallizing material-containing layer is disposed in the light-emitting layer 233.

In this case, the self-crystallizing material-containing layer is located between the hole transport region 231 and the light-emitting layer 233. As shown in FIG. 4, the hole transport region 231 may include a hole injection layer 231a and a hole transport layer 231b. The hole transport region 231 may include any one selected from the hole injection layer 231a and the hole transport layer 231b. This self-crystallizing material-containing layer may have a plurality of embossed nanopatterns on at least one of the first surface of the light-emitting layer 233 in contact with the hole transport region 231 and the second surface thereof, i.e., the surface opposite to the first surface.

Figure 5:
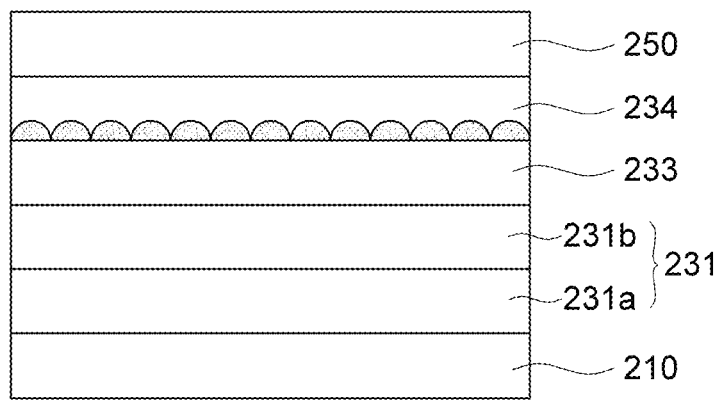
Figure 6:
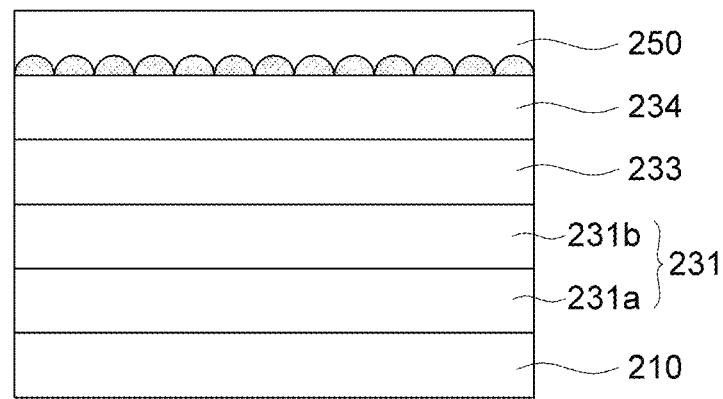

Referring to FIGS. 5-6, an organic light-emitting diode according to an exemplary embodiment of the present disclosure includes: a first electrode 210; a second electrode 250 disposed opposite to the first electrode; and a hole transport region 231, a light-emitting layer 233, and an electron transport region 234 disposed between the first electrode and the second electrode. A self-crystallizing material-containing layer is disposed in the electron transport region 234.

In this case, the self-crystallizing material-containing layer is located between the light-emitting layer 233 and the electron transport region 234. This self-crystallizing material-containing layer may have a plurality of embossed nanopatterns on at least one of the first surface of the electron transport region 234 in contact with the light-emitting layer 233 and the second surface thereof, i.e., a surface opposite to the first surface.

The above-described organic light-emitting diode according to the present disclosure includes the self-crystallizing material-containing layer in one region of the organic layer disposed between the opposite first and second electrodes, for example, in at least one of the hole transport region, the light-emitting layer, and the electron transport region. Accordingly, there may be achieved the effects of suppressing or reducing the occurrence of a short circuit between the first electrode and the second electrode attributable to the Ag metal particles of the surface of the first electrode and minimizing or reducing the development of dark spots.

Organic Light-Emitting Display Device

Another exemplary embodiment of the present disclosure is directed to a display device, for example, an organic light-emitting display device, which includes the above-described organic light-emitting diode.

An organic light-emitting display device according to a second exemplary embodiment of the present disclosure will be described below with reference to FIGS. 7-9.

Figure 7:
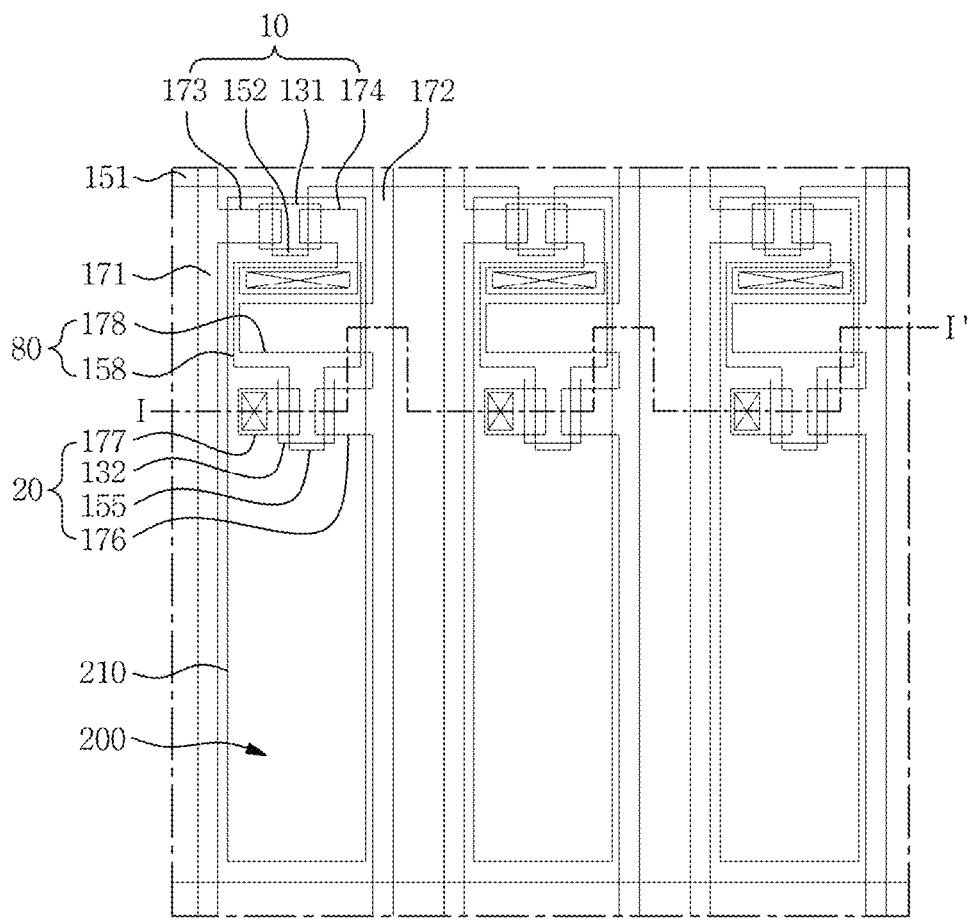
FIG. 7 is a plan view illustrating an organic light-emitting diode according to a second exemplary embodiment of the present disclosure.

FIG. 7 is a top view illustrating an organic light-emitting diode according to one exemplary embodiment of the present disclosure.

Referring to FIG. 7, the organic light-emitting display device of the present disclosure includes a plurality of pixel regions defined by gate lines 151 arranged in one direction, data lines 171 crossing the gate lines 151 in an insulation fashion, and common power supply lines 171. In this case, one pixel is disposed in each of the pixel regions. However, the pixel regions are not limited thereto. Alternatively, the pixel regions may be defined by a pixel-defining layer as described below, and a plurality of pixels may be disposed in each of the pixel regions.

In the organic light-emitting display device of the present disclosure, each pixel has a 2TFT-1CAP structure including: two thin-film transistors (TFTs) including a switching thin-film transistor 10 and a driving thin-film transistor 20; and one capacitor (CAP) 80. However, the pixel is not limited thereto, and may include three or more thin-film transistors and two or more capacitors.

The switching thin-film transistor 10 selects a pixel from which light is to be emitted. This switching thin-film transistor 10 includes: a switching gate electrode 152 coupled to (e.g., connected to) the gate line 151; a source electrode 173 coupled to (e.g., connected to) the data line 171; a switching drain electrode 174 coupled to (e.g., connected to) any one capacitor plate of the capacitor 80; and a switching semiconductor layer 131.

The driving thin-film transistor 20 applies a driving voltage to the first electrode 210, which is a pixel electrode of the organic light-emitting diode 200, in order to emit light from the light-emitting layer 233 of the organic light-emitting diode 200 in the pixel selected by the switching thin-film transistor 10. This driving thin-film transistor 20 includes: a gate electrode 155 coupled to (e.g., connected to) a first capacitor plate 158; a driving source electrode 176 coupled to (e.g., connected to) a common power supply line 171; a driving drain electrode 177 coupled to (e.g., connected to) the first electrode 210 of the organic light-emitting diode through a contact hole; and a driving semiconductor layer 132.

The capacitor 80 includes a first capacitor plate 158, a second capacitor plate 178, and an interlayer insulating layer 145 interposed between the first capacitor plate and the second capacitor plate. The first capacitor plate 158 is disposed and coupled between (e.g., connected between) the switching drain electrode 174 and the driving gate electrode 155, and the second capacitor plate 178 is coupled to (e.g., connected to) the common power supply line 172. Furthermore, the interlayer insulating layer 145 serves as a dielectric. The capacitance of the capacitor 80 is determined by the charge stored in the capacitor 80 and the voltage applied between the two capacitor plates 158 and 178.

In the structure of this organic light-emitting display device, the switching thin-film transistor 10 is configured to be operated by a gate voltage applied to the gate line 151 so as to transfer a data voltage, applied to the data line 171, to the driving thin-film transistor 20. In this case, the capacitor 80 stores a voltage corresponding to the difference between a data voltage, transferred through the switching thin-film transistor 10, and a common voltage applied from the common power supply line 172 to the driving thin-film transistor 20, and a current corresponding to the voltage stored in the capacitor 80 flows through the driving thin-film transistor 20 to the light-emitting layer 233 of the organic light-emitting diode 200, with the result that the light-emitting layer 233 emits light.

Figure 8:
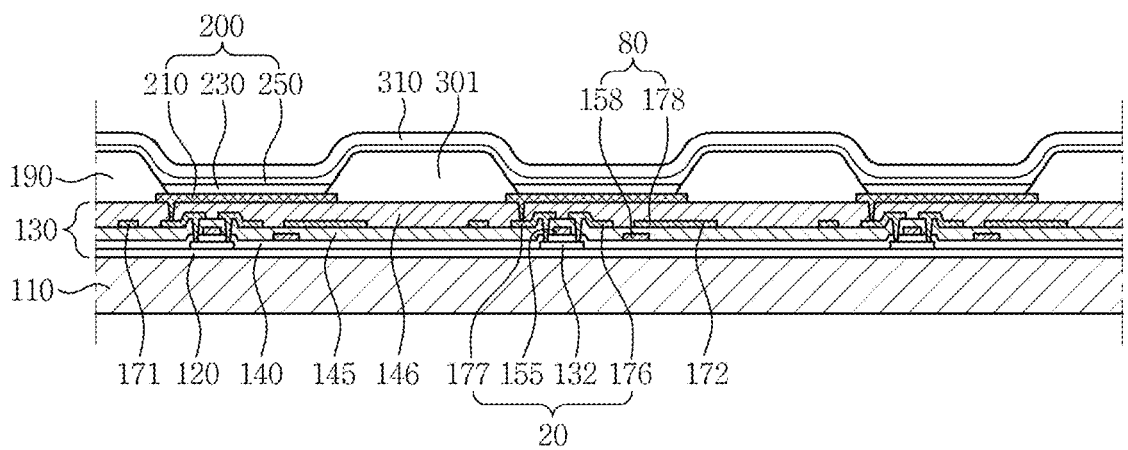
FIG. 8 is a cross-sectional view taken along line I-I' of FIG. 7.

FIG. 8 is a cross-sectional view taken along line I-I' of FIG. 7, which illustrates one exemplary embodiment of the present disclosure.

Referring to FIG. 8, an organic light-emitting display device according to the exemplary embodiment of the present disclosure includes a substrate 110, a circuit driving unit 130, and an organic light-emitting diode 200.

In the organic light-emitting display device of the present disclosure, the substrate 110 may include an insulating material selected from the group consisting of glass, quartz, ceramic, and plastic. However, the substrate 110 is not limited thereto, but may include a metallic material, such as stainless steel.

On this substrate 110, a buffer layer 120 may be further disposed. The buffer layer 120 may include one or more layers selected from among various suitable inorganic and organic layers. This buffer layer 120 functions to prevent impurity elements, such as oxygen, or unnecessary components, such as water, from penetrating (or to reduce a likelihood or degree of such penetration) into the driving circuit unit 130 or the organic light-emitting diode 200, and also functions to planarize the surface of the substrate 110. However, the buffer layer 120 is not essential, and may be omitted.

Furthermore, a gate insulating layer 140 may further be disposed between the gate electrode 152 or 155 and the semiconductor layer 131 or 132 on the substrate 110, and an interlayer insulating layer 145 may further be disposed between the first capacitor plate 158 and the second capacitor plate 178.

Furthermore, a planarizing layer 146 may be further disposed on the interlayer insulating layer 145. The planarizing layer 146 may include an insulating material, and functions to protect the driving circuit unit 130. The planarizing layer 146 may include the same (e.g., substantially the same) material as the above-described interlayer insulating layer 145.

In the organic light-emitting display device of the present disclosure, the driving circuit unit 130 is disposed on the substrate 110 (or the buffer layer 120). The driving circuit unit 130 includes the switching thin-film transistor 10, the driving thin-film transistor 20, and the capacitor 80, and drives the organic light-emitting diode 200.

In the organic light-emitting display device of the present disclosure, the organic light-emitting diode 200 is configured to display an image by emitting light in response to a driving signal received from the driving circuit unit 130. As shown in FIG. 3, the organic light-emitting diode 200 includes a first electrode 210, an organic layer, and a second electrode 250, which are deposited over the substrate 110.

Since the first electrode 210 and the second electrode 250 are the same (e.g., substantially the same) as described above in conjunction with the organic light-emitting diode, redundant descriptions thereof are not necessary here.

The organic layer 230 includes a hole transport region 231, a light-emitting layer 233, an electron transport region 234, and a diffusion barrier layer 235. Optionally, the organic layer 230 may further include an auxiliary light-emitting layer 232 disposed between the hole transport region 231 and the light-emitting layer 233, and/or a capping layer 310 disposed on the second electrode 250.

Figure 9:
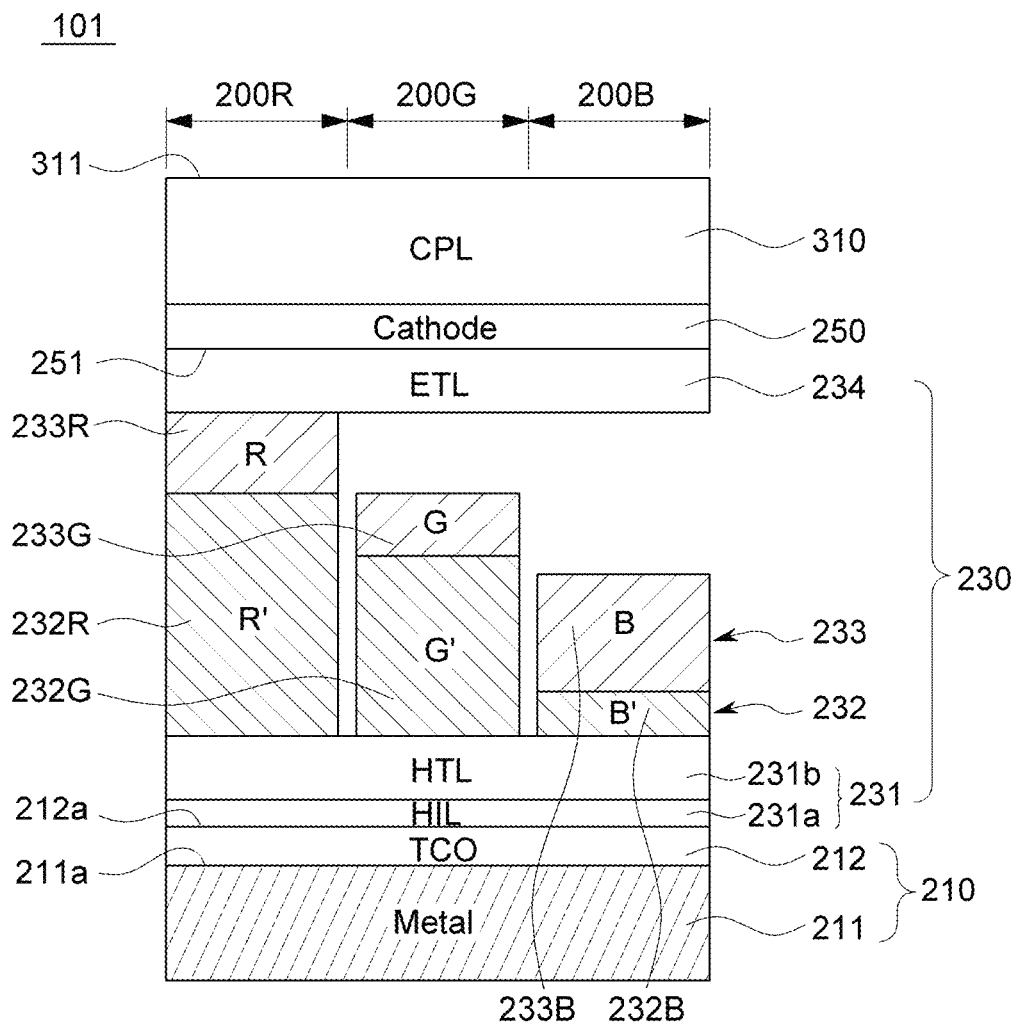
FIG. 9 is a schematic view illustrating the organic light-emitting display device of FIG. 7.

As shown in FIG. 9, the hole transport region 231 may include a hole injection layer 231*a* and a hole transport layer 231*b*. The hole transport region 231 may include any one selected from the hole injection layer 231*a* and the hole transport layer 231*b*. Furthermore, the electron transport region 234 may only the electron transport layer 234 (see FIG. 9), may further include an electron injection layer disposed between the electron transport layer 234 and the second electrode 250, or may include only the electron injection layer instead of the electron transport layer 234. Furthermore, since the individual components of the organic light-emitting display device are the same as described above in conjunction with the organic light-emitting diode, and therefore, detailed descriptions thereof are not necessary here.

In the organic light-emitting display device of the present disclosure, the pixel-defining layer 190 serves to define pixel regions, and has openings. The opening of the pixel-defining layer 190 exposes a portion of the first electrode 210. In the opening of the pixel-defining layer 190, the first electrode 210, the organic layer 230, and the second electrode 250 are sequentially deposited. In this case, a portion of the second electrode 250 and a portion of the organic layer 230 may be disposed to overlap each other on the pixel-defining layer 190. Furthermore, at least a portion of the organic layer 230 may be disposed on the pixel-defining layer 190.

The organic light-emitting display device of the present disclosure may include a thin film encapsulating layer disposed on the capping layer 310 in order to protect the organic light-emitting diode 200. The thin film encapsulating layer has a structure in which at least one organic layer and at least one inorganic layer are alternately disposed. This thin film encapsulating layer may prevent water or external gas, such as oxygen, from penetrating into the organic light-emitting diode 200 (or may reduce a likelihood or degree of such penetration).

Furthermore, in the organic light-emitting display device of the present disclosure, an encapsulating substrate may be disposed over the second electrode to be spaced apart from the second electrode 250. The encapsulating substrate may include a transparent material, such as quartz, glass, ceramic or plastic. This encapsulating substrate is bonded to and sealed along with the substrate 110, and covers the organic light-emitting diode 200.

Meanwhile, the organic light-emitting diode 200 and the organic light-emitting display device 101 have a multilayer stack structure, and a significant portion of the light emitted from the organic light-emitting layer 233 cannot pass (or substantially cannot pass) through this multilayer stack structure and, thus, cannot be emitted to (or substantially cannot be emitted to) the outside. For this reason, loss of light is caused in the organic light-emitting display device.

In order to allow the light emitted from the light-emitting layer 233 to be effectively emitted to the outside, a micro-cavity structure is applied to the organic light-emitting diode 200. When light is repeatedly reflected between the first electrode 210 including the reflective layer 211 and the second electrode 250 being a transflective layer, light having a set or specific wavelength corresponding to the reflection distance may be amplified, and light having other wavelengths may be cancelled out. The amplified light may be emitted to the outside through the second electrode 250 which is a transflective layer.

Current organic light-emitting display devices, for example, top-emission (AMOLED) organic light-emitting display devices, employ second resonance structures having thicknesses of about 270 nm, 230 nm, and 180 nm for red, green and blue organic light-emitting diodes, respectively. If the organic layer is made thicker in order to form a microcavity as described above, the amount of organic materials used will increase, thereby increasing the manufacturing cost of the organic light-emitting display device. For this reason, according to the present disclosure, by introducing the organic light-emitting diode into which the self-crystallizing material-containing layer has been introduced as described above, the thickness of the first resonance structure (in which the thickness of the organic layer is small) thinner than the structure of the second resonance structure is applied, thereby minimizing or reducing the probability of developing progressive dark spots attributable to the small thickness of the organic layer.

In this case, each layer of the organic light-emitting diode should have a thickness equal to or larger than the minimum layer thickness such that it can perform its function. When the minimum layer thickness and the efficiency of thin-layer processes are considered, it is required that the organic light-emitting diode be designed such that the first resonance occurs between the first electrode 210 and the second electrode 250, for example, between the reflective layer 211 of the first electrode 210 and the second electrode 250.

FIG. 9 is a schematic view illustrating the organic light-emitting display device 101 of FIG. 8.

Referring to FIG. 9, the organic light-emitting display device 101 according to the first exemplary embodiment of the present disclosure has a structure in which the first resonance of each of red, green and blue lights occurs between the first electrode 210 and second electrode 250 of each respective one of a red organic light-emitting diode 200R, a green organic light-emitting diode 200G, and a blue organic light-emitting diode 200B.

For this purpose, the organic layer 230 disposed between the first electrode and second electrode of the red organic light-emitting diode 200R according to the first exemplary embodiment of the present disclosure may have a thickness of 100 to 120 nm, for example, 105 to 115 nm. Furthermore, the organic layer 230 disposed between the first electrode and second electrode of the green organic light-emitting diode 200G may have a thickness of 80 to 100 nm, for example, 85 to 95 nm. Furthermore, the organic layer 230 disposed between the first electrode and second electrode of the blue organic light-emitting diode 200B may have a thickness of 60 to 70 nm, for example, 64 to 68 nm.

For example, the light-emitting layer 233R of the red organic light-emitting diode 200R has a thickness of 10 to 40 nm. When the red light-emitting layer 233R has a thickness of 10 to 40 nm, light may be emitted from the red organic light-emitting layer 233R. Furthermore, the auxiliary light-emitting layer 232R of the red organic light-emitting diode 200R may have a thickness of 5 to 40 nm, for example, 10 to 35 nm. When the thickness of another layer of the organic layer 230 changes, the thickness of the auxiliary light-emitting layer 232R may change also. The auxiliary light-emitting layer 232R may function to transport holes to the organic light-emitting diode 233, and may also function to adjust the thickness of the organic layer 230.

Furthermore, the light-emitting layer 233G of the green organic light-emitting diode 200G may have a thickness of 10 to 40 nm, for example, 20 to 30 nm. Furthermore, the auxiliary light-emitting layer 232G may have a thickness of 10 to 25 nm, for example, 18 to 22 nm.

Furthermore, the light-emitting layer 233B of the blue organic light-emitting diode 200B may have a thickness of 10 to 20 nm, for example, 12 to 15 nm. Furthermore, the auxiliary light-emitting layer 232B may have a thickness of 0 to 5 nm, for example, 3 to 5 nm.

Each of a hole injection layer 231a, a hole transport layer 231b, and an electron transport region 234 is deposited to be shared by the red, green and blue organic light-emitting diodes 200R, 200G and 200B. The hole injection layer 231a may have a thickness of 5 to 10 nm. The hole transport layer 231b may have a thickness of 5 to 20 nm. Furthermore, the electron transport region 234 may have a thickness of 20 to 40 nm.

In order to achieve the resonance between the reflective layer 211 of the first electrode 210 and the top 311 of the capping layer 310, the thickness of the capping layer 310 may be controlled. For example, the capping layer 310 of the organic light-emitting display device 102 according to the first exemplary embodiment of the present disclosure may have a thickness of 60 to 100 nm, for example, 80 nm.

A second exemplary embodiment of the present disclosure will be described below with reference to FIG. 10.

Figure 10:
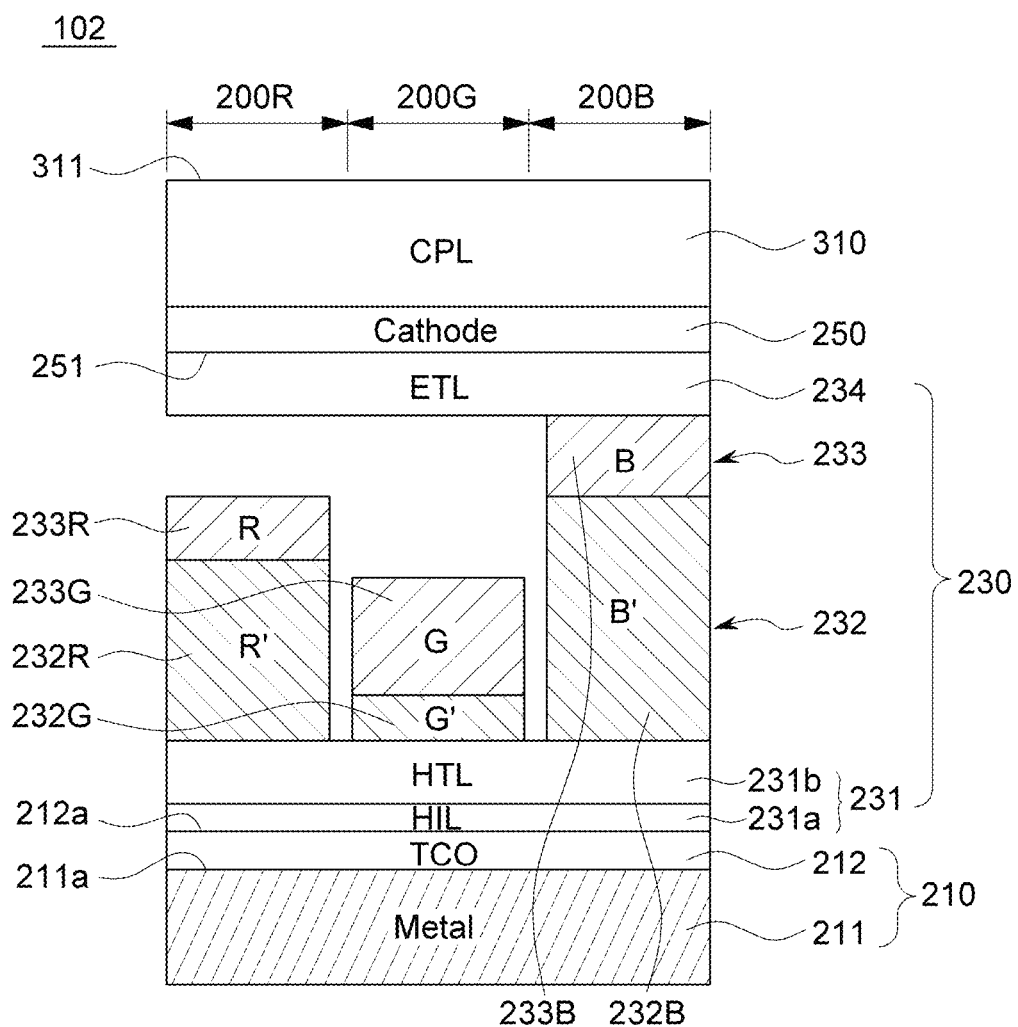
FIG. 10 is a schematic view illustrating an organic light-emitting display device according to a second exemplary embodiment of the present disclosure.

FIG. 10 is a schematic view illustrating an organic light-emitting display device 102 according to the second exemplary embodiment of the present disclosure. The descriptions of the components described in conjunction with the first exemplary embodiment would be redundant and are not necessary here.

Unlike red and green organic light-emitting diodes, blue organic light-emitting diodes having the first resonance thickness reduce the efficiency thereof compared to those having the second resonance structure when the blue organic light-emitting diodes have the first resonance thickness. For this reason, in the second exemplary embodiment of the present disclosure, the first resonance structure is applied to the red and green light-emitting diodes, and the second resonance structure is applied to the blue light-emitting diode.

The organic light-emitting display device 102 according to the second exemplary embodiment of the present disclosure has the first resonance structure in which red and green lights resonate primarily in the red organic light-emitting diode 200R and the green organic light-emitting diode 200G, respectively, and also has the second resonance structure in which blue light resonates secondarily in the blue organic light-emitting diode 200B.

For this purpose, the organic layer 230 of the red organic light-emitting diode 200R according to the second exemplary embodiment of the present disclosure may have a thickness of 100 to 120 nm, for example, 105 to 115 nm. Furthermore, the organic layer 230 of the green organic light-emitting diode 200G may have a thickness of 80 to 100 nm, for example, 85 to 95 nm. Furthermore, the organic layer 230 of the blue organic light-emitting diode 200B may have a thickness of 175 to 195 nm, for example, 178 to 185 nm.

For example, the light-emitting layer 233R of the red organic light-emitting diode 200R may have a thickness of 10 to 40 nm, for example, 20 to 35 nm. Furthermore, the auxiliary light-emitting layer 232R of the red organic light-emitting diode 200R may have a thickness of 5 to 40 nm, for example, 10 to 35 nm.

Furthermore, the light-emitting layer 233G of the green organic light-emitting diode 200G may have a thickness of 10 to 40 nm, for example, 20 to 30 nm. Furthermore, the auxiliary light-emitting diode 232G may have a thickness of 0 to 25 nm, for example, 10 nm.

Furthermore, the light-emitting layer 233B of the blue organic light-emitting diode 200B may have a thickness of 10 to 20 nm, for example, 12 to 15 nm. Furthermore, the auxiliary light-emitting layer 232B may have a thickness of 80 to 120 nm, for example, 90 to 100 nm.

Each of a hole injection layer 231a, a hole transport layer 231b, and an electron transport region 234 is deposited to be shared by the red, green and blue organic light-emitting diodes 200R, 200G and 200B. The hole injection layer 231a may have a thickness of 5 to 10 nm. The hole transport layer 231b may have a thickness of 5 to 40 nm. Furthermore, the electron transport region 234 may have a thickness of 20 nm to 40 nm. Furthermore, the capping layer 310 of the organic light-emitting display device 102 according to the second exemplary embodiment of the present disclosure may have a thickness of 60 to 100 nm, for example, 80 to 90 nm.

Figure 11:
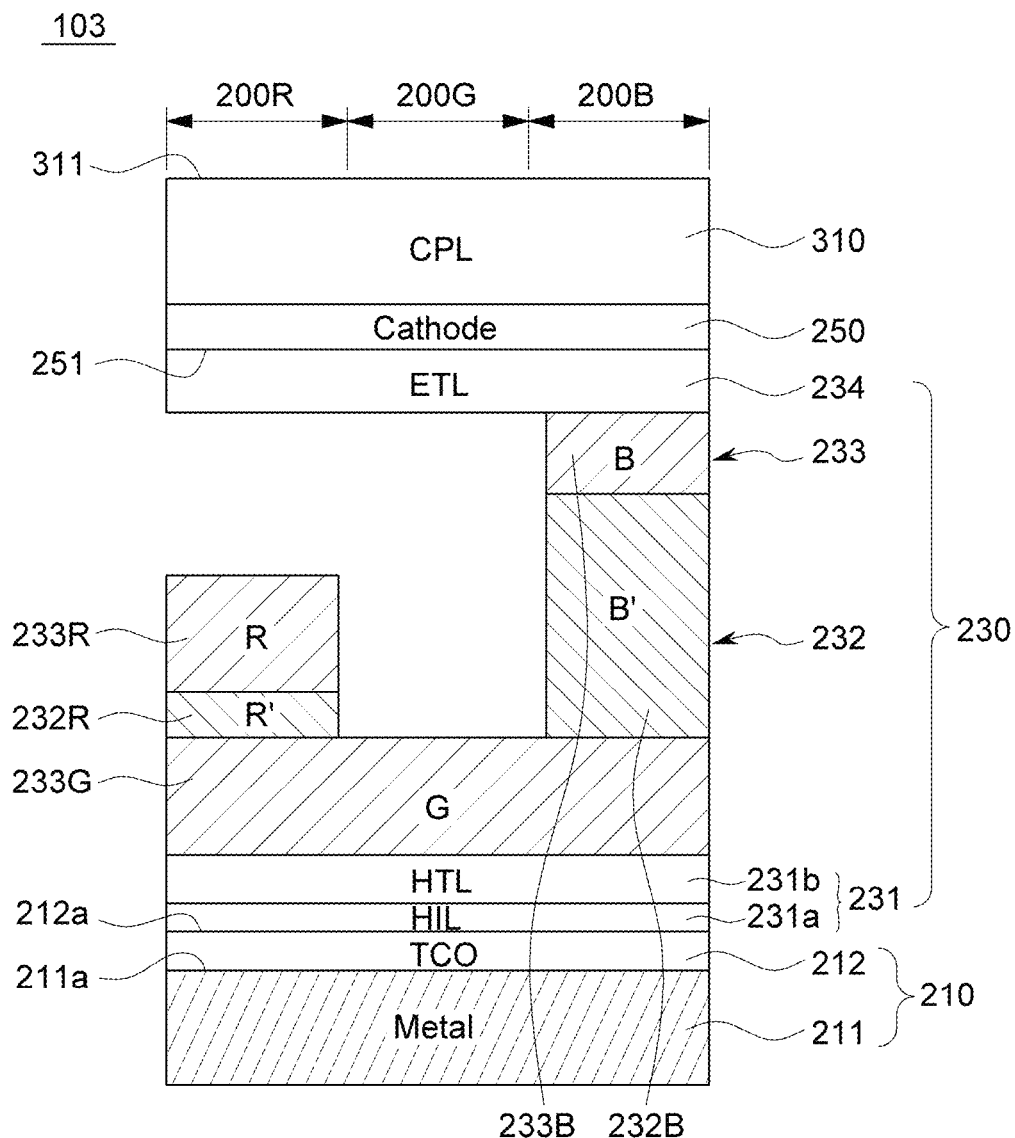
FIG. 11 is a schematic view illustrating an organic light-emitting display device according to a third exemplary embodiment of the present disclosure.

FIG. 11 is a schematic view illustrating an organic light-emitting display device according to a third exemplary embodiment of the present disclosure.

The organic light-emitting display device 103 according to the third exemplary embodiment has the first resonance structure in which red and green lights resonate in a red organic light-emitting diode 200R and a green organic light-emitting diode 200G, respectively, and also has the second resonance structure in which blue light resonates in a blue organic light-emitting diode 200B. In this case, the light-emitting layer 233G of the green organic light-emitting diode is used as a green common layer (GCL). The light-emitting layer 233G of the green organic light-emitting diode that is used as the common layer may be disposed at the bottom of each of the light-emitting layer 233R of the red organic light-emitting diode and the light-emitting layer 233B of the blue organic light-emitting diode.

The thickness of each of the red organic light-emitting diode 200R, green organic light-emitting diode 200G and blue organic light-emitting diode 200B in the third exemplary embodiment of the present disclosure is the same as that in the above-described second exemplary embodiment.

For example, the light-emitting layer 233G of the green organic light-emitting diode 200G that is used as the green common layer (GCL) may have a thickness of 10 nm to 40 nm, for example, 15 to 30 nm.

Furthermore, the light-emitting layer 233R of the red organic light-emitting diode 200R may have a thickness of 10 to 40 nm, for example, 10 to 20 nm. Furthermore, the auxiliary light-emitting layer 232R of the red organic light-emitting diode 200R may have a thickness of 5 to 40 nm, for example, 10 to 35 nm.

Furthermore, the light-emitting layer 233B of the blue organic light-emitting diode 200B may have a thickness of 10 to 20 nm, for example, 12 to 15 nm. Furthermore, the auxiliary light-emitting layer 232B may have a thickness of 60 to 100 nm, for example, 70 to 80 nm.

Since the thicknesses of the hole injection layer 231a, the hole transport layer 231b, and the electron transport region 234 according to the third exemplary embodiment of the present disclosure are the same as described above in conjunction with the second embodiment, and redundant descriptions thereof are not necessary here.

Figure 12:
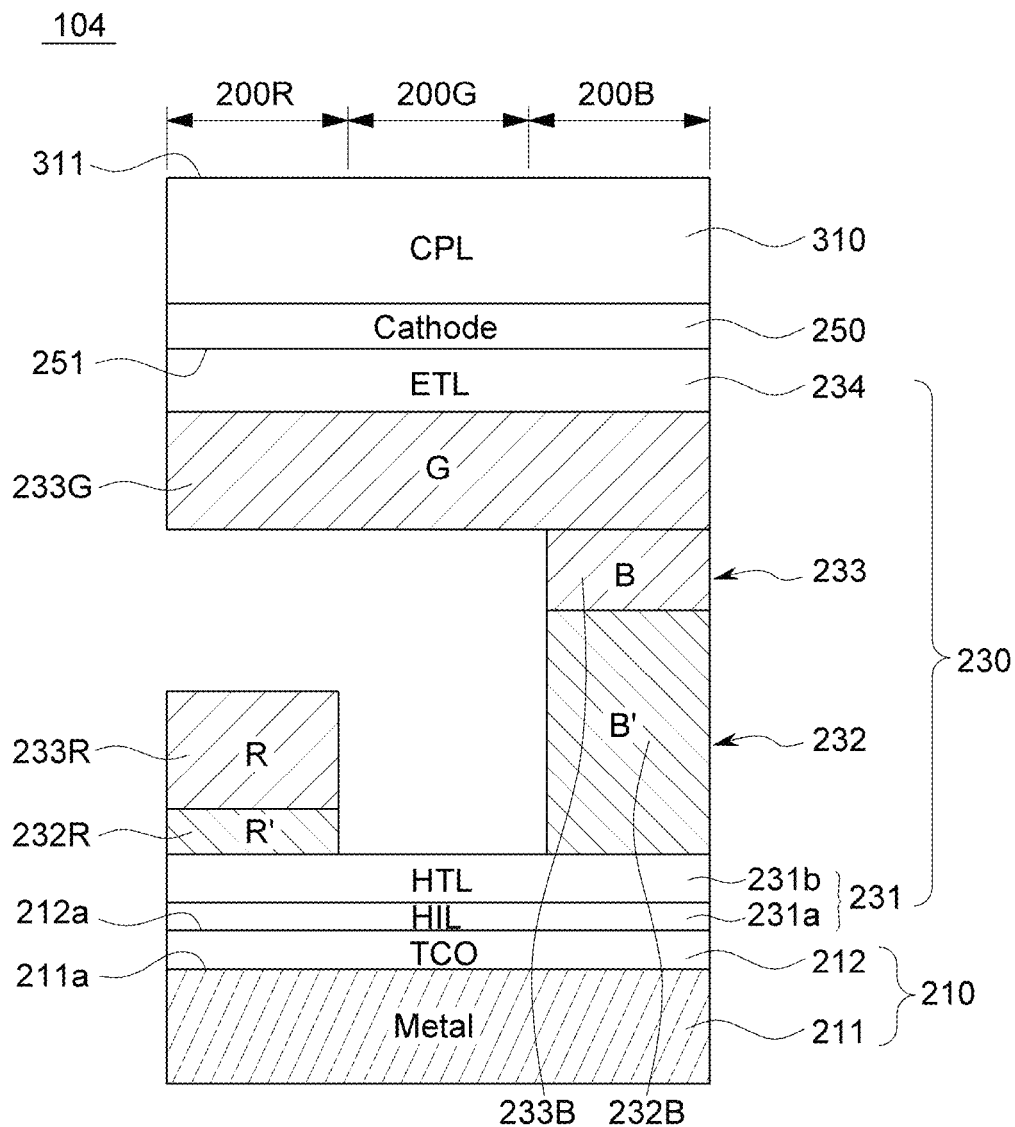
FIG. 12 is a schematic view illustrating an organic light-emitting display device according to a fourth exemplary embodiment of the present disclosure.

FIG. 12 is a schematic view illustrating an organic light-emitting display device 102 according to a fourth exemplary embodiment of the present disclosure.

The organic light-emitting display device 102 according to the fourth exemplary embodiment of the present disclosure has the first resonance structure in which red and green lights resonate primarily in the red organic light-emitting diode 200R and the green organic light-emitting diode 200G, respectively, and also has the second resonance structure in which blue light resonates secondarily in the blue organic light-emitting diode 200B. In this case, the light-emitting layer 233G of the green organic light-emitting diode is used as a green common layer (GCL). The green organic light-emitting layer 233G that is used as the common layer may be disposed on the top of each of the light-emitting layer 233R of the red organic light-emitting diode and the light-emitting layer 233B of the blue organic light-emitting diode.

Since the thickness of the organic layer 230 in each of the red organic light-emitting diode 200R, green organic light-emitting diode 200G and blue organic light-emitting diode 200B according to the fourth exemplary embodiment of the present disclosure, the thicknesses of the light-emitting layer 233R, 233G or 233B, auxiliary light-emitting layer 232R or 232B, hole injection layer 231a, hole transport layer 231b, and electron transport region 234 of the organic layer, and the thickness of the capping layer 310 are the same as described above in conjunction with the third embodiment, and therefore, redundant descriptions thereof are not necessary here.

Figure 13:
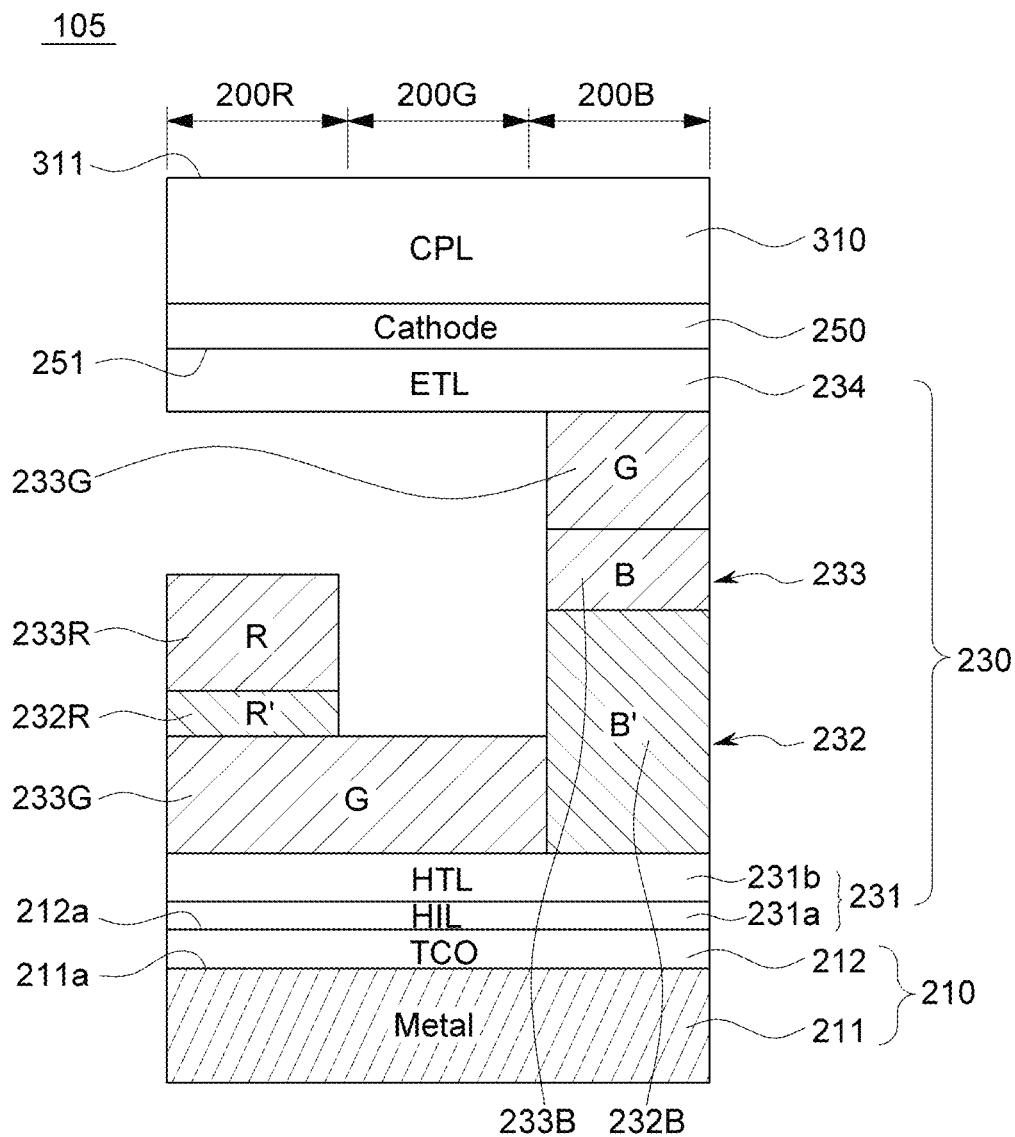
FIG. 13 is a schematic view illustrating an organic light-emitting display device according to a fifth exemplary embodiment of the present disclosure.

FIG. 13 is a schematic view illustrating an organic light-emitting display device 102 according to a fifth exemplary embodiment of the present disclosure.

The organic light-emitting display device 102 according to the fifth exemplary embodiment of the present disclosure has the first resonance structure in which red and green lights resonate primarily in the red organic light-emitting diode 200R and the green organic light-emitting diode 200G, respectively, and also has the second resonance structure in which blue light resonates secondarily in the blue organic light-emitting diode 200B. In this case, the light-emitting layer 233G of the green organic light-emitting diode is used as a green common layer (GCL). The green light-emitting layer 233G that is used as the common layer is a hybrid structure which is disposed on each of the bottom of the light-emitting layer 233R of the red organic light-emitting diode and the top of the light-emitting layer 233B of the blue organic light-emitting diode.

Since the thickness of the organic layer 230 in each of the red organic light-emitting diode 200R, green organic light-emitting diode 200G and blue organic light-emitting diode 200B according to the fifth exemplary embodiment of the present disclosure, the thicknesses of the light-emitting layer 233R, 233G or 233B, auxiliary light-emitting layer 232R or 232B, hole injection layer 231a, hole transport layer 231b, and electron transport region 234 of the organic layer, and the thickness of the capping layer 310 are the same as described above in conjunction with the third embodiment, and therefore, redundant descriptions thereof are not necessary here.

Figure 14:
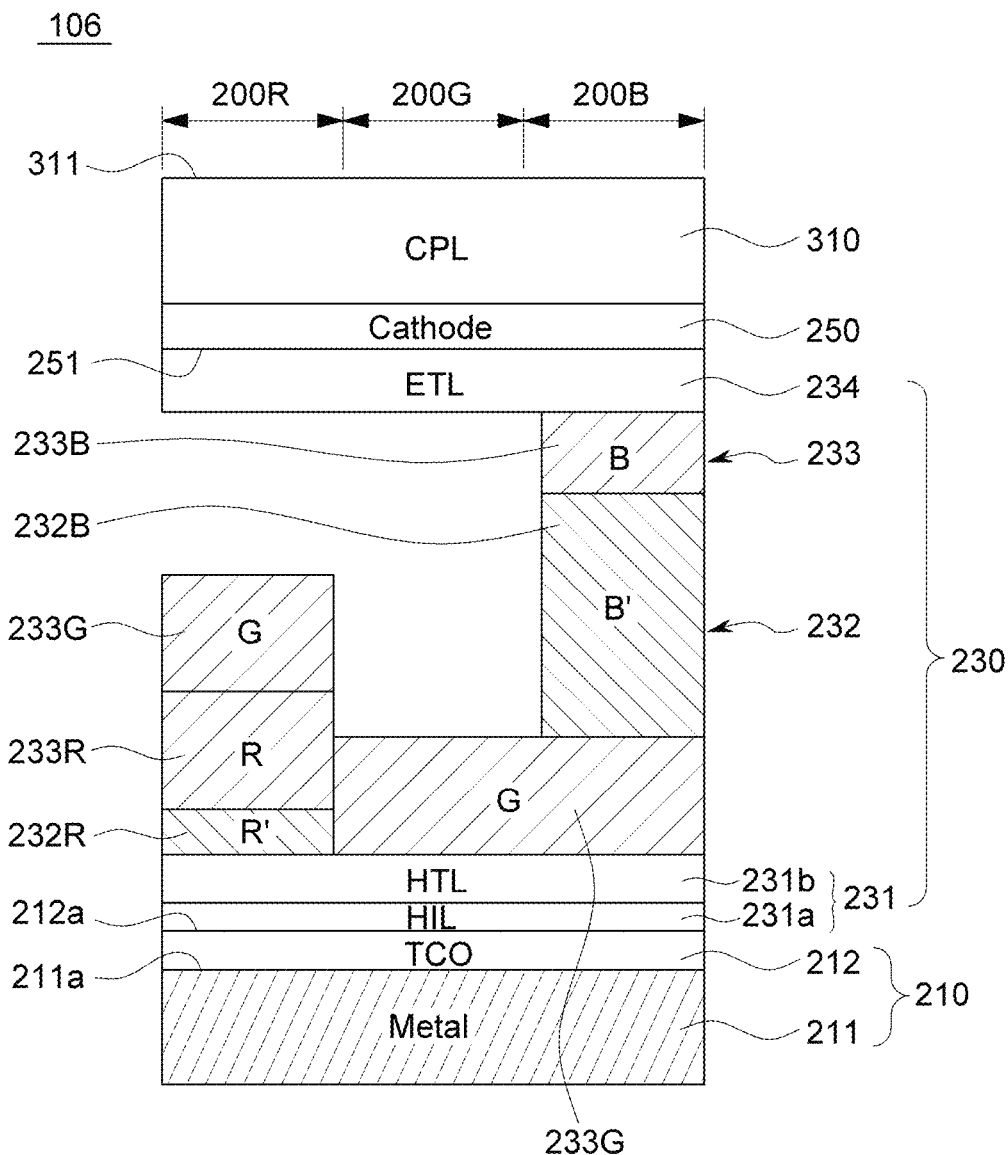
FIG. 14 is a schematic view illustrating an organic light-emitting display device according to a sixth exemplary embodiment of the present disclosure.

FIG. 14 is a schematic view illustrating an organic light-emitting display device 102 according to a sixth exemplary embodiment of the present disclosure.

The organic light-emitting display device 102 according to the fifth exemplary embodiment of the present disclosure has the first resonance structure in which red and green lights resonate primarily in the red organic light-emitting diode 200R and the green organic light-emitting diode 200G, respectively, and also has the second resonance structure in which blue light resonates secondarily in the blue organic light-emitting diode 200B. In this case, the light-emitting layer 233G of the green organic light-emitting diode is used as a green common layer (GCL). The green light-emitting layer 233G that is used as the common layer is a hybrid structure which is disposed on each of the top of the light-emitting layer 233R of the red organic light-emitting diode and the bottom of the light-emitting layer 233B of the blue organic light-emitting diode.

Since the thickness of the organic layer 230 in each of the red organic light-emitting diode 200R, the green organic light-emitting diode 200G, and the blue organic light-emitting diode 200B according to the sixth exemplary embodiment of the present disclosure, and the thicknesses of the light-emitting layer 233R, 233G or 233B, auxiliary light-emitting layer 232R or 232B, hole injection layer 231a, hole transport layer 231b, and electron transport region 234 of the organic layer, and the thickness of the capping layer 310 are the same as described above in conjunction with the third embodiment, and therefore, redundant descriptions thereof are not necessary here.

The above-described organic light-emitting display devices include an organic layer having a small thickness that makes the first resonance structure possible, and thus these display devices have the effects of reducing material cost and also minimizing or reducing the development of dark spots. Accordingly, these display devices have excellent luminous efficiency, and may be applied to flexible organic light-emitting display devices that have recently attracted a lot of attention in the display field, as well as lighting devices.

The subject matter of the present disclosure will be described in further detail below with reference to examples. However, these examples are intended to illustrate the subject matter of the present disclosure, but the scope of the present disclosure is not limited to these examples.

Example 1: Fabrication of Organic Light-Emitting Display Device into which Self-Crystallizing Material-Containing Layer has been Introduced A top emission-type green first resonance organic light-emitting diode was fabricated.

More specifically, on a 5.1"-sized ITO/Ag/ITO (first electrode) substrate (panel) having Full High Definition (FHD) resolution, a material having a self-crystallizing property and a p-type dopant including carbonitrile, such as hexaaza-triphenylene-hexacarbonitrile or the like, were co-deposited to form a hole injection layer having a thickness of 5 nm.

Then, the material represented by Formula 5 was deposited on the hole injection layer to form a hole transport layer having a thickness of 30 nm. On the hole transport layer, CBP and Ir(ppy)$_3$ were co-deposited to a weight ratio of 100:6 to form a green light-emitting layer having a thickness of 15 nm. On the green light-emitting layer, the material represented by Formula 6 was deposited to form an electron transport layer having a thickness of 35 nm, and, on the electron transport layer, Liq as a diffusion barrier material was deposited to a thickness of 3 nm. On the diffusion barrier layer, ytterbium (Yb) as an electron injection layer material was deposited to form an electron injection layer having a thickness of 5 nm, and, on the electrode injection later, a silver magnesium alloy (AgMg) was deposited to form a counter electrode having a thickness of 13 nm. On the counter electrode, an optical auxiliary layer having a thickness of 90 nm was vacuum-deposited, thereby fabricating a top-emission green organic light-emitting diode using the first resonance structure and also fabricating an organic light-emitting display device including the same. In this case, the hole injection layer used the self-crystallizing material represented by Formula 2a below. The fabrication of the organic light-emitting display device was performed inside a high-vacuum chamber with a vacuum level of 1×10$^{-7}$ Torr.

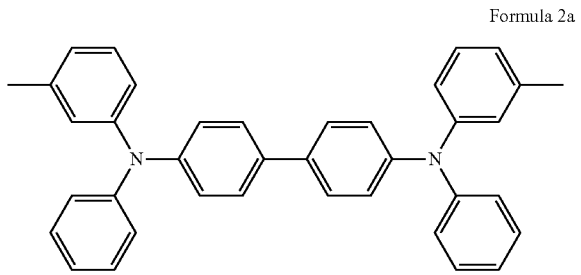

Formula 2a

Formula 5

Formula 6

Example 2: Fabrication of Organic Light-Emitting Display Device into which Self-Crystallizing Material-Containing Layer has been Introduced The organic light-emitting display device of Example 2 was fabricated in substantially the same manner as described in Example 1, except that a hole injection layer formed by co-depositing the self-crystallizing material represented by Formula 2a and a p-type inorganic dopant CuI (10% doping) was used.

Comparative Example 1

An organic light-emitting display device was fabricated in substantially the same manner as described in Example 1, except that a self-crystallizing material-containing layer was not formed on the first electrode.

Test Example 1: Evaluation of Physical Properties of Self-Crystallizing Material-Containing Layer (1)

Deposition was performed by applying the self-crystallizing material represented by Formula 2a on an ITO—Ag—ITO three-layer first electrode, and then an organic light-emitting display device was fabricated in substantially the same manner as described in Example 1.

FIG. 15 shows Scanning Electron Microscopy (SEM) images illustrating the self-crystallizing material-containing layer of an organic light-emitting display device. It can be seen that the self-crystallizing material-containing layer included a plurality of nanocrystals and embossed nanopatterns were formed on the surface of the nanocrystals. Furthermore, it can be seen that Ag metal particles were captured inside the self-crystallizing material-containing layer.

Test Example 2 Evaluation of Physical Properties of Self-Crystallizing Material-Containing Layer (2)

Physical properties were evaluated using the organic light-emitting display devices fabricated in Examples 1 and 2.

Figure 17A:
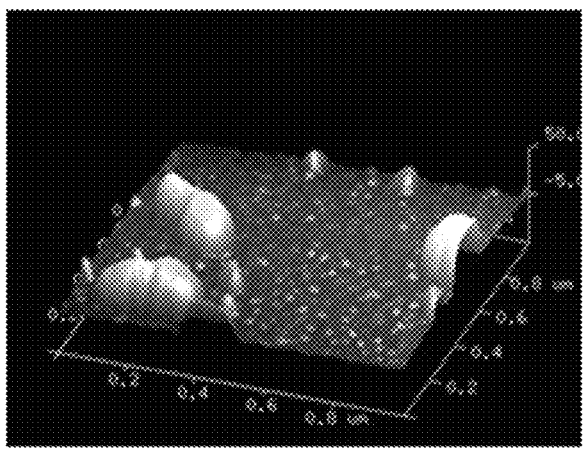
FIGS. 17A-17B show Atomic Force Microscopy (AFM) images illustrating the cross-sectional structures of the organic light-emitting diodes of Examples 1 and 2 into each of which a self-crystallizing material-containing layer has been introduced.
Figure 17B:
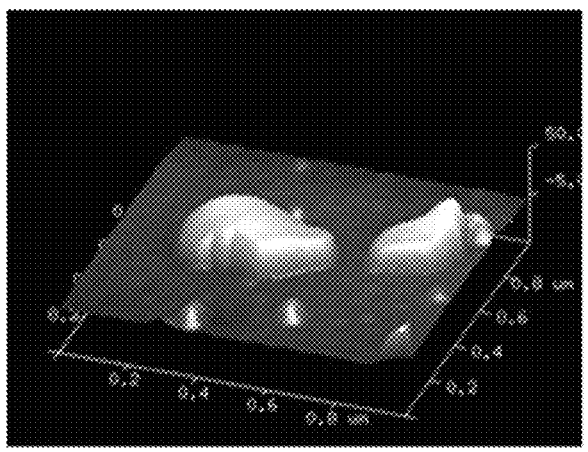

FIGS. 16A-16B show TEM images illustrating the cross-sections of self-crystallizing material-containing layers provided in the organic light-emitting display devices of Examples 1 and 2, respectively, and FIGS. 17A-17B show AFM images illustrating the cross-sections of self-crystallizing material-containing layers provided in the organic light-emitting display devices of Examples 1 and 2, respectively.

Referring to FIGS. 16A-16B, it can be seen that in Example 1 in which the self-crystallizing material was used alone, the cathode diffusion of metal particles occurred partially (see FIG. 16A). In contrast, it can be seen that in Example 2 in which the self-crystallizing material and the p-type inorganic dopant were used in a mixed manner, the density of the self-crystallizing material-containing layer was increased due to the p-type inorganic dopant, with the result that the cathode diffusion of metal particles was significantly reduced (see FIG. 16B).

Furthermore, referring to FIGS. 17A-17B, it can be seen that in Example 1 in which the self-crystallizing material was used alone, defects were partially exposed on the surface of the electrode during a crystallization process (see FIG. 17A). In contrast, it can be seen that in Example 2 in which the self-crystallizing material and the p-type inorganic dopant were used in a mixed manner, the density of the self-crystallizing material-containing layer was increased due to the p-type inorganic dopant, with the result that defects on the surface of the electrode (e.g., an anode) were significantly mitigated (see FIG. 17B).

Test Example 3: Evaluation of Development of Dark Spots in Organic Light-Emitting Display Devices Using the organic light-emitting display devices fabricated in Examples 1 and 2 and Comparative Example 1, the development of dark spots per cell of the diode of each of the display devices was measured.

For example, the cross-section of each of the organic light-emitting display devices was photographed by an SEM, and the number of dark spots in each cell (5.1" size and FHD resolution) of the green light-emitting diode was measured as a first-resonance basis. The numbers of measured dark spots are shown in Table 1 below:

TABLE 1

| | Number of dark spots | Number of cells | Number of dark spots per cell |
|---|---|---|---|
| Example 1 | 21 | 65 | 0.3 |
| Example 2 | 3 | 5 | 0.6 |
| Comparative Example 1 | 126 | 85 | 1.5 |

Referring to Table 1 above, it can be seen that the development of dark spots in the organic light-emitting display devices of Examples 1 and 2 into each of which the self-crystallizing material-containing layer has been introduced was significantly decreased by about 20% compared to that in Comparative Example 1. Accordingly, it can be also seen that in the organic light-emitting display device of the present disclosure into which the self-crystallizing material-containing layer has been introduced, the organic layer has a small thickness so that the first resonance structure can be applied thereto, and the development of dark spots is minimized or reduced, thereby exhibiting the effect of improving yield.

As described above, the organic light-emitting display device according to the exemplary embodiment of the present disclosure includes an organic layer having a small thickness. Accordingly, the organic light-emitting display device can be manufactured at a low cost.

Furthermore, in the organic light-emitting display device according to the exemplary embodiment of the present disclosure, the development of dark spots of metal ion attributable to the small thickness of the organic layer can be minimized or reduced.

Moreover, the organic light-emitting display device according to the exemplary embodiment of the present disclosure makes it possible to reduce the thickness of materials used for each pixel, thereby increasing yield per time and also increasing the continuous operation time of a production line for display devices.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the exemplary embodiments of the present disclosure have been described with reference to the accompanying drawings, it will be appreciated by a person having ordinary knowledge in the art to which the present disclosure pertains that the subject matter of the present disclosure may be practiced in other set or specific forms without changing the technical spirit and feature of the present disclosure. Therefore, it should be understood that the above-described embodiments are illustrative from all aspects and are not limiting.

What is claimed is:

1. An organic light-emitting diode comprising:
    a first electrode;
    a second electrode disposed opposite to the first electrode;
    a light-emitting layer disposed between the first electrode and the second electrode;
    a hole transport region disposed between the first electrode and the light-emitting layer; and
    an electron transport region disposed between the light-emitting layer and the second electrode;
    wherein the hole transport region comprises at least two layers, one of the at least two layers is in contact with the first electrode and is a self-crystallizing material-containing layer, and the first electrode comprises at least two layers including a silver (Ag)-based reflective layer.

2. The organic light-emitting diode of claim 1, wherein the self-crystallizing material-containing layer comprises a self-crystallizing material having a glass transition temperature of 150° C. or lower.

3. The organic light-emitting diode of claim 1, wherein the self-crystallizing material-containing layer comprises a plurality of circular or hemispheric nanocrystals having a cross-sectional diameter of 40 to 200 nm and a height of 40 to 200 nm.

4. The organic light-emitting diode of claim 1, wherein the self-crystallizing material-containing layer comprises a plurality of embossed nanopatterns on at least one of a first surface thereof in contact with the first electrode and a second surface thereof opposite to the first surface.

5. The organic light-emitting diode of claim 1, wherein the self-crystallizing material-containing layer has a single or multilayer structure comprising at least one p-type inorganic dopant.

6. The organic light-emitting diode of claim 5, wherein a doping quantity of the p-type inorganic dopant ranges from 0.5 to 50 weight % based on a total weight of the corresponding self-crystallizing material-containing layer.

7. The organic light-emitting diode of claim 1, wherein the hole transport region comprises at least two selected from a hole injection layer, a hole transport layer, and a buffer layer, and the self-crystallizing material-containing layer is a hole injection layer.

8. An organic light-emitting display device comprising:
    a substrate; and
    a plurality of red organic light-emitting diodes, green organic light-emitting diodes, and blue organic light-emitting diode disposed on the substrate;
    wherein each of the plurality of red organic light-emitting diodes, green organic light-emitting diodes, and blue light-emitting diodes comprises:
    a first electrode disposed on the substrate;
    an organic layer disposed on the first electrode, and comprising a hole transport region, a light-emitting layer, and an electron transport region; and
    a second electrode disposed on the organic layer;
    wherein the hole transport region comprises at least two layers, and one of the at least two layers is in contact with the first electrode and is a self-crystallizing material-containing layer, and the first electrode comprises at least two layers including a silver (Ag)-based reflective layer.

9. The organic light-emitting display device of claim 8, wherein the self-crystallizing material-containing layer comprises a self-crystallizing material having a glass transition temperature of 150° C. or lower.

10. The organic light-emitting display device of claim 8, wherein the self-crystallizing material-containing layer comprises a plurality of circular or hemispheric nanocrystals having a cross-sectional diameter of 40 to 200 nm and a height of 40 to 200 nm.

11. The organic light-emitting display device of claim 8, wherein the self-crystallizing material-containing layer comprises a plurality of embossed nanopatterns on at least one of a first surface thereof in contact with the first electrode and a second surface thereof opposite to the first surface.

12. The organic light-emitting display device of claim 8, wherein the self-crystallizing material-containing layer has a single or multilayer structure comprising at least one p-type inorganic dopant.

13. The organic light-emitting display device of claim 12, wherein a doping quantity of the p-type inorganic dopant ranges from 0.5 to 50 weight % based on a total weight of the corresponding self-crystallizing material-containing layer.

14. The organic light-emitting display device of claim 8, wherein the hole transport region comprises at least two selected from a hole injection layer, a hole transport layer, and a buffer layer, and the self-crystallizing material-containing layer is a hole injection layer.

15. The organic light-emitting display device of claim 8, wherein:

the organic layer of the red organic light-emitting diode has a thickness of 100 to 120 nm;

the organic layer of the green organic light-emitting diode has a thickness of 80 to 100 nm; and the organic layer of the blue organic light-emitting diode has a thickness of 60 to 70 nm.

16. The organic light-emitting display device of claim 8, wherein:

the organic layer of the red organic light-emitting diode has a thickness of 100 to 120 nm;

the organic layer of the green organic light-emitting diode has a thickness of 80 to 100 nm; and the organic layer of the blue organic light-emitting diode has a thickness of 180 to 190 nm.

17. An organic light-emitting display device comprising:

a substrate; and a plurality of red organic light-emitting diodes, green organic light-emitting diodes, and blue organic light-emitting diode disposed on the substrate;

wherein each of the plurality of red organic light-emitting diodes, green organic light-emitting diodes, and blue light-emitting diodes comprises:

a first electrode disposed on the substrate;

an organic layer disposed on the first electrode, and comprising a hole transport layer, a light-emitting layer, and an electron transport layer; and a second electrode disposed on the organic layer;

wherein any one selected from the hole transport layer, the light-emitting layer, and the electron transport layer comprises a self-crystallizing material, the first electrode comprises at least two layers including a silver (Ag)-based reflective layer, and wherein:

the organic layer of the red organic light-emitting diode has a thickness of 100 to 120 nm;

the organic layer of the green organic light-emitting diode has a thickness of 80 to 100 nm; and the organic layer of the blue organic light-emitting diode has a thickness of 60 to 70 nm, or the organic layer of the blue organic light-emitting diode has a thickness of 180 to 190 nm.

18. The organic light-emitting display device of claim 17, wherein the any one selected from the electron transport layer, the light-emitting layer, and the electron transport layer including the self-crystallizing material has a plurality of embossed nanopatterns on at least one of a first surface of the corresponding layer and a second surface opposite to the first surface.

* * * * *